United States Patent [19]
Vu et al.

[11] Patent Number: 5,668,505
[45] Date of Patent: Sep. 16, 1997

[54] RING OSCILLATOR HAVING TWO RINGS WHOSE OUTPUTS ARE COMBINED

[75] Inventors: Hoai X. Vu, Stanton, Calif.; Toan Vu, Lake Grove, N.Y.

[73] Assignee: Symbol Technologies, Inc., Holtsville, N.Y.

[21] Appl. No.: 614,592

[22] Filed: Mar. 13, 1996

[51] Int. Cl.$^6$ ........................................ H03B 5/02
[52] U.S. Cl. ................... 331/49; 331/2; 331/34; 331/56; 331/57; 331/177 R; 331/179; 455/76
[58] Field of Search .......................... 331/57, 49, 56, 331/177 R, 179, 34

[56] References Cited

PUBLICATIONS

IEEE Journal of Solid–State Circuits, vol. 25, No. 1, Feb. 1990 "A 300–MHZ CMOS Voltage–Controlled Ring Oscillator", Enam et al, pp. 312–315.

Primary Examiner—Siegfried H. Grimm

[57] ABSTRACT

An oscillator is provided having a plurality of cascade coupled inverters. Each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. In a preferred embodiment, each amplifier in the ring includes an n channel transistor (nMOS transistor) connected in a totem pole arrangement, to a p channel transistor (pMOS transistor). The gate of the nMOS transistor provides the n-input and gate of the pMOS transistor provides the p-input. The source and drain paths of the pMOS and nMOS transistors are connected together to provide an output for the amplifier. With such arrangement, because the gate of the more slowly responding pMOS transistor is driven before the gate of the nMOS transistor the oscillator is adapted to operate at a higher frequency of oscillation.

5 Claims, 12 Drawing Sheets

RING OSCILLATOR HAVING TWO RINGS WHOSE OUTPUTS ARE COMBINED

BACKGROUND OF THE INVENTION

This invention relates generally to oscillators more particularly to complementary metal oxide semiconductor (CMOS) oscillators.

As is known in the art, oscillators are used to generate a signal having a frequency selected in accordance with an applied control signal (i.e., a voltage controlled oscillator, VCO). One technique used to fabricate such VCO is with a ring of serially connected inverters as described in FIG. 3 of an article entitled "A 300-MHZ CMOS Voltage-Controlled Ring Oscillator" by S. K. Enam and Asad A. Abidi, IEEE Journal of Solid State Circuits Vol. 25, No. 1, February 1990. Each inverter in the ring-VCO includes an n channel transistor (nMOS transistor) connected in a totem pole arrangement to a p channel transistor (pMOS transistor). The gates of the nMOS and pMOS transistors are connected together to provide a common input for the inverter and the drain and source paths pMOS and nMOS transistors are connected together to provide an output for the inverter. The ring VCO has an inner ring with an odd number of inverters and an outer ring, fed by an output of the inner ring, having an even number of inverters. The outer and inner rings feed a pair of transistors having gates connected to a control voltage. The pair of transistors are arranged to provide a potentiometer which vectorially adds the signals produced by the inner and outer rings in a proportion selected by the control signal. The inner ring provides a signal which oscillates at the highest frequency of the VCO and the outer ring produces a signal which oscillates at the lowest VCO frequency. The pair of potentiometer-arranged transistors produce an output signal having a frequency intermediate between these two extremes. The frequency of oscillation is determined by the total propagation delay through each ring and the control voltage. More particularly, the transistors in each inverter circuit are driven periodically at the frequency of oscillation into complementary conducting/nonconducting states. Because pMOS transistors switch between conducting/non-conducting states slower than nMOS transistors, the oscillation frequency of the inner ring, i.e., the maximum frequency, is constrained by the gain-bandwidth capability of the pMOS transistors.

SUMMARY OF THE INVENTION

In accordance with the present invention an oscillator is provided having a plurality of cascade coupled inverters. Each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. In a preferred embodiment, each amplifier in the ring includes an n channel transistor (nMOS transistor) connected in a totem pole arrangement, to a p channel transistor (pMOS transistor). The gate of the nMOS transistor provides the n-input and gate of the pMOS transistor provides the p-input. The source and drain paths of the pMOS and nMOS transistors are connected together to provide an output for the amplifier. With such arrangement, because the gate of the more slowly responding pMOS transistor is driven before the gate of the nMOS transistor the oscillator is adapted to operate at a higher frequency of oscillation.

In one embodiment, the ring oscillator provides the inner, higher oscillation frequency, ring of a two ring VCO. The outputs of the two rings are combined in a transistor circuit arranged to provide for vectorially adding the signals produced by the two rings in proportion dictated by a control signal. In one arrangement the second outer ring includes at least two inverters and in another embodiment the outer ring includes a transistor have a gate geometry selected to provide the signal produced in the outer ring with the minimum frequency for the VCO.

DESCRIPTION OF THE PREFERRED EMBODIMENTS

Tranceiver-General Overview

Figure 1:
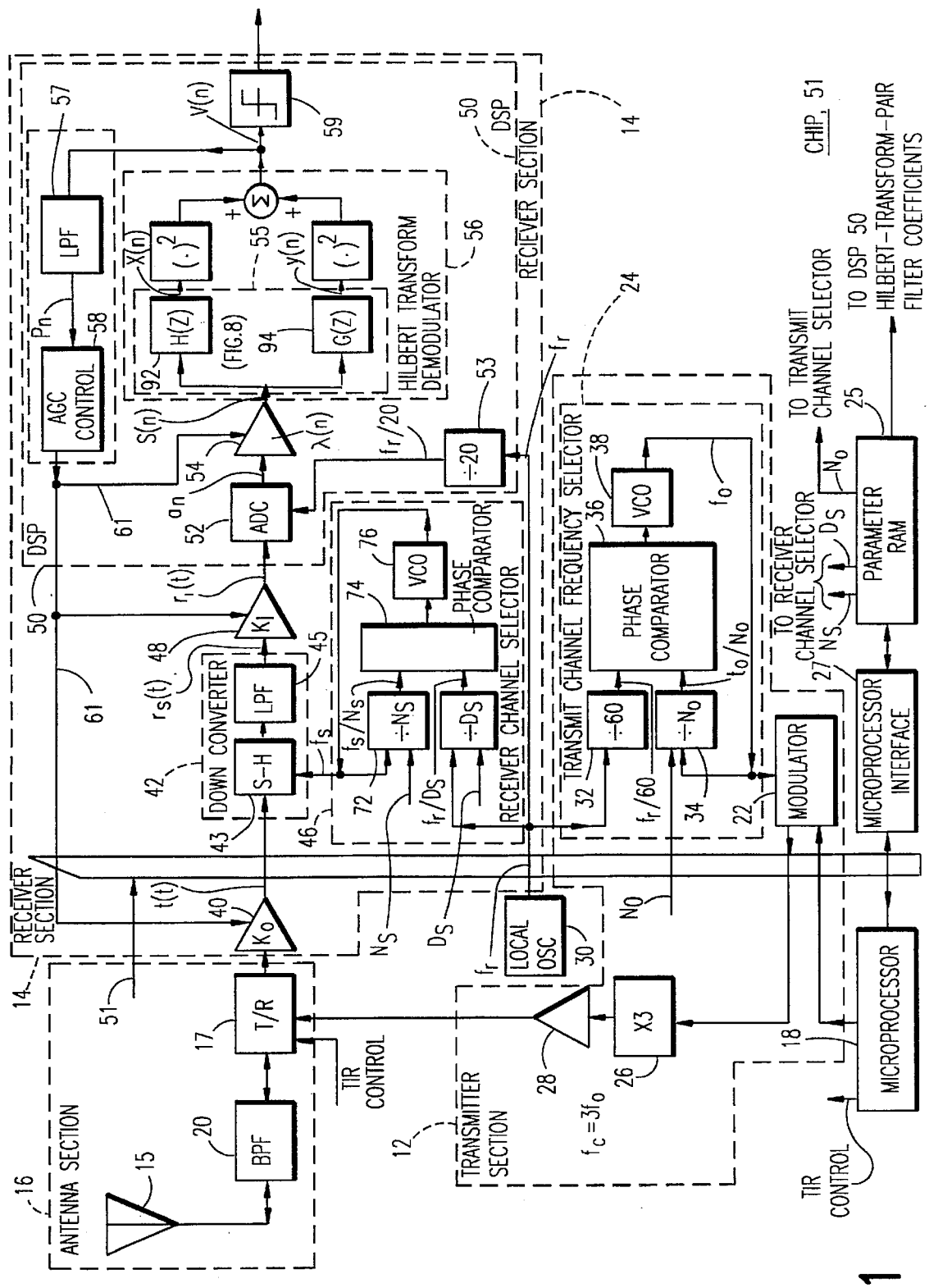
FIG. 1 is a block diagram of a transceiver, such transceiver having an oscillator according to the invention.

Referring now to FIG. 1, a transceiver 10 is provided having a transmitter section 12 and a receiver section 14 coupled to an antenna section 16. The antenna section 16 includes: an antenna 15; a conventional transmit/receive (T/R) switch 17 controlled by a T/R control signal from microprocessor 18 to place the transceiver 10 in either the transmit (T) mode or the receive (R) mode; and, an image rejection bandpass filter 20, as shown.

Transmitter Section 12

The transmitter section 12 includes: a modulator 22; a transmit channel frequency selector 24; a frequency multiplier 26 and a power amplifier 28 arranged as shown. Modulator 22 is here an on-off keyed amplitude modulation (AM) modulator to superimpose information, (i.e., binary data), from the microprocessor 18 onto the amplitude of a suitable radio frequency (RF) carrier signal, such as a microwave frequency carrier signal. Here, the transmitter section 12 is adapted to transmit the data on a selected one of a plurality of carrier frequency channels. The carrier frequency is selected by a transmit channel selector 24 in response to data read from a parameter random access memory (RAM) 25. The RAM 25 is read in response to signals fed thereto from microprocessor 18 via microprocessor interface 27. Here, the transmit channel selector 24 produces a signal having a frequency one third the frequency of the transmitted carrier signal. Therefore, the modulated signal is fed to the frequency multiplier 26, here a times three frequency multiplier, to produce the transmitted carrier frequency, $f_c$, after passing through the power amplifier 28 to the T/R switch 17, the band pass filter 20 and antenna 15. Here, the signal produced by the transmit channel selector 24 has a frequency in one of 100 equally spaced frequency channels extending from 800.33 MHz to 833.33 MHz. Therefore, the times three frequency multiplier 28 upconverts the signal produced by the transmit channel selector 24 to 2.401 GHz to 2.500 GHz, respectively, resulting in 100 equally spaced frequency channels $200_1$–$200_N$, the frequency spectra, R(f) being shown in FIG. 2A. It is noted that because the signals transmitted are "real" signals, the transmit frequency spectrum has both positive and negative frequency components, as shown.

More particularly, transmit channel selector 24 is fed by a local oscillator 30, here a crystal oscillator which produces a local oscillator frequency, $f_r$, here 20 MHz +/–20 ppm). The transmit channel selector 24 has two frequency dividers, a divide by 60 frequency divider 32 fed by the local oscillator signal $f_r$ to produce a signal having a frequency $f_r/60$, here 0.33 MHz, and a divide by $N_o$ frequency divider 34, where $N_o$ is an integer provided by the microprocessor 18 to select the carrier frequency $f_{C1}$–$f_{CN}$ to be transmitted. The output signals produced by the frequency dividers 32, 34 are fed to a phase comparator 36. A signal representative of the phase difference in the two signals is used to control a voltage controlled oscillator 38, the details of which will be described in connection with FIGS. 3, 4 and 5. Suffice it to say here, however, that the signal produced by the VCO 38 is fed back to the divide by $N_o$ frequency divider 34 to provide a phase locked loop. That is, in the steady state, the frequency, produced by the divide by $N_o$ frequency divider 34 will be forced equal to $f_r/60$. Thus, the frequency, of, of the signal produced by the VCO 38 will be forced equal to $(N_o/60)(f_r)$, here $N_o/3$ MHz. The signal produced by the VCO 38 is fed to the modulator 22 and, as noted above, has a frequency one third of the selected carrier frequency, $f_c$, used to transmit the data. Thus, here $N_O$ is one of 100 integers ranging from 2401, 2402, . . . 2500.

Receiver Section 14

The receiver section 14 includes: a low noise amplifier 40; a downconverter 42, here including a sample-hold circuit 43 and low pass filter 45; a receiver channel selector 46; a coarse AGC circuit 48; and a digital signal processor (DSP) 50. The receiver channel selector 46 will be described in detail hereinafter. Suffice it to say here however that the receiver channel selector 46 provides sampling signals at a sampling frequency, $f_s$, for the sample hold circuit 43 to downconvert the carrier frequency of a received signal within a selected one of the plurality of frequency channels, $200_1$–$200_N$, to a predetermined intermediate frequency, $f_{if}$, here δ/4, where δ is the adjacent-channel carrier frequency separation between channels $200_1$–$200_N$. Here, δ=1 MHZ and therefore $f_{if}$ is here 250 KHz.

The digital signal processor 50 includes: an analog to digital converter (ADC) 52 sampled by signals from a frequency divider 53, here a divide by 20 frequency divider fed by the local oscillator 30; a fine AGC circuit 54; a demodulator 56, here having a pair of Hilbert-Transform-pair filters in 55, to be described in detail hereinafter, for recovering the baseband data from the downconverted, intermediate frequency signal passed by low pass filter 45; an AGC control 58, responsive to the power in the demodulated signal, for adjusting the gains in the coarse AGC circuit 48, fine AGC circuit 54, and low noise amplifier 40, in a manner to be described in detail hereinafter and, a threshold circuit 59. It should be noted that the modulator 22, downconverter 42, receiver channel selector 46, transmit channel selector 24 digital signal processor 56, microprocessor interface 25, parameter RAM 25, and twenty to one frequency divider 53 are formed on a single semiconductor body, or chip 51. Here, the semiconductor body is silicon and such circuits are formed using CMOS technology with the transistors thereof having gate channel lengths in the order of one micrometer. (It should be noted that while the active elements, i.e., transistors, are formed on the chip 51, some passive elements, i.e., resistors and capacitors, not shown, used for a low pass filter 45 of downconverter 42 and VCOs 38, 76, to be described, are external to the chip 51 and are interconnected by contact pads on the chip 51 in a conventional manner).

Downconverter 42

The downconverter 42, as noted above includes: a sample-hold circuit 43, sampled by signals generated by the receiver channel selector 46; and, a bandpass filter 45. The sampling frequency, $f_s$, fed to the sample-hold circuit 43 has a selected one of 100 sampling frequencies. Each one of the 100 selectable sampling frequencies results in the received microwave signal fed thereto being down converted to a common intermediate frequency, here 250 KHz. Thus, the receiver has a plurality of, here 100, selectable frequency channels, each one thereof being selected by the frequency of the sampling signal. Each one of the channels has a predetermined bandwidth, here $f_b$. It should be noted that, for reasons to be described, the sampling frequency, $f_s$, which is less than twice the predetermined bandwidth, $f_b$, of each one of the channels, is selected to convert the frequency of a signal within a selected one of the frequency channels to the intermediate frequency, $f_{if}$, here 250 KHz, and to convert the frequencies of signals in the unselected channels to frequencies greater than the intermediate frequency, $f_{if}$. It is noted that, regardless of which one of the frequency channels $200_1$–$200_N$ is selected, the effect of the sampling frequency, $f_s$, is to convert the frequency of the signal in the selected one of the frequency channels to the same intermediate frequency, $f_{if}$.

More particularly, the sampling frequency, $f_s$, is selected by the receiver channel selector 46 responding to signals $N_s$, $D_s$ provided by the microprocessor 18 through interface 27 and RAM 25. Given that the receiver frequency channels have a predetermined frequency separation, δ, here 1 MHz; the sampling frequency, $f_s$, is given by:

$$f_s = \frac{4f_c - \delta}{4K} \geq N\delta \qquad (1)$$

where $f_c$ is the carrier frequency of the selected frequency channel and K is a computed positive constant selected to translate the desired carrier frequency channel to within the pass band of the low pass filter 45 and to translate the frequencies of the undesired channels outside of the pass band of lowpass filter 45.

Figure 2A:
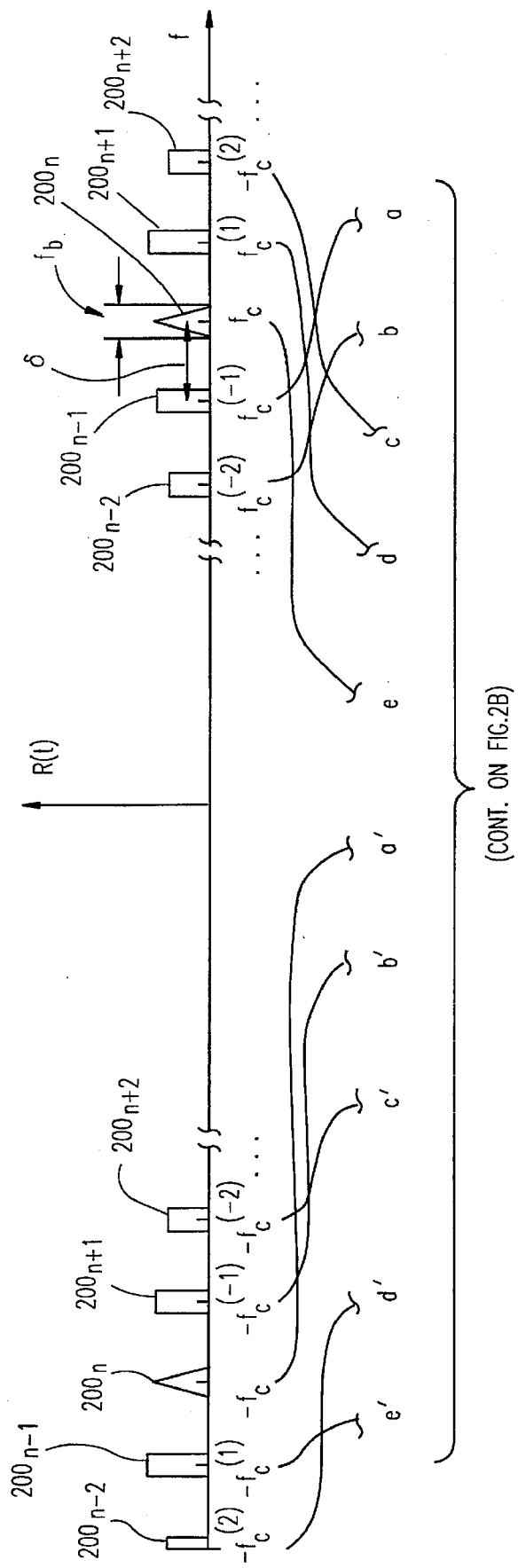
FIG. 2A is the frequency spectrum of a plurality of frequency channels adapted to be transmitted, or received by, the transceiver of FIG. 1.
Figure 2B:
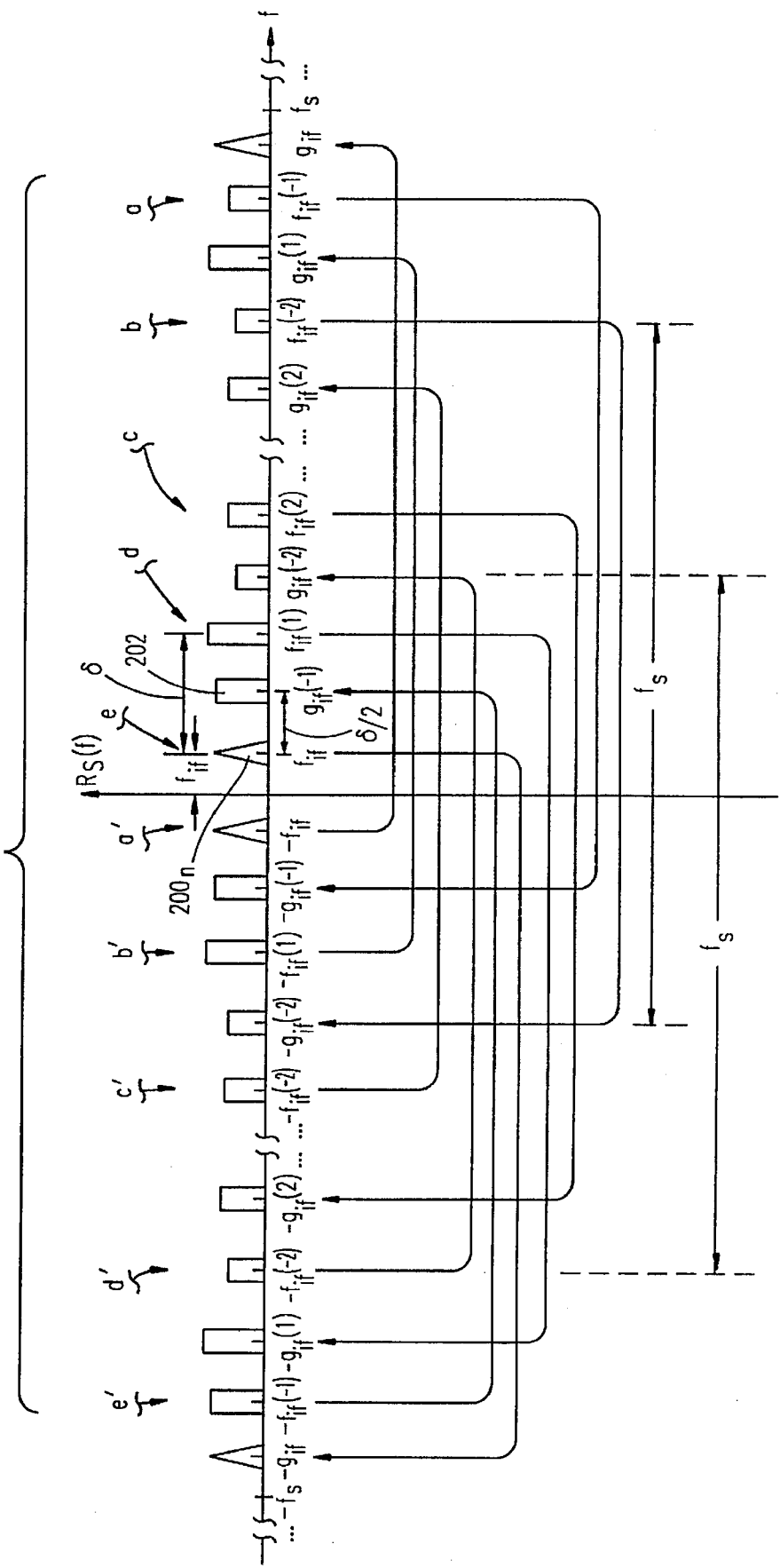
FIG. 2B is the frequency spectrum of signals after a selected one of the received channels has been sampled and downconverted by the transceiver of FIG. 1.

Referring to FIGS. 2A and 2B, the frequency spectrum R(f) of the received signal r(t) produced at the output of low noise amplifier 40 contains N channels $200_1$, $200_2$, ..., $200_n$, ..., $200_N$ spaced by a constant frequency separation $\delta$ and N=100. Sample and hold circuit 43 of downconverter 42 (FIG. 1) samples r(t) to produce duplicates of R(f) at multiples of the sampling frequency $f_s$ in the sample hold circuit 43; i.e, having a sampled frequency spectrum, $R_s(f)$, as shown in FIG. 2B. As a result, a channel of interest $200_n$, (i.e., the selected one of the N channels) with symmetric components at the carrier frequencies $f_c$ and $-f_c$ is shifted to intermediate frequencies $f_{if}$, $-f_{if}$ and frequencies spaced from $f_{if}$ by multiples of the sampling frequency $f_s$.

The sample hold circuit 43 therefore shifts channel $200_n$ to the lowest intermediate frequency ($f_{if}=\delta/4$) that maximizes the separation between channels in the downconverter 42, (i.e., the sampled signal frequency spectrum, $R_s(f)$). Choosing fs in the manner to be described causes the signals in the unselected channels in $R_s(f)$ to shift to frequencies greater than the intermediate frequency, $f_{if}$, here greater than $\delta/4=250$ KHz plus half the bandwidth $f_b$ of the channel. That is, as noted above, the bandwidth, $f_b$, of each one of the channels $200_1$–$200_N$ is less than half the channel separation, $\delta$. That is, each channel $200_1$–$200_N$ has a bandwidth, $f_b$, less than $\delta/2$, here less than 500 KHz. The low pass filter 45 has a center frequency of dc (i.e., zero frequency) and a bandwidth less than $\pm(\delta/2)$. Therefore, the signal in the selected one of the channels $200_1$–$200_N$, here the channel of interest $f_n$, being at $f_{if}$ and having a bandwidth within the pass band of the low pass filter 45 will pass through the low pass filter 45 while the signals in the unselected channels will be rejected by the filter 45 for further processing because the nearest channel will have a center frequency of $f_{if}+(\delta/2)=3\delta/4$.

The intermediate frequency $f_{if}$ that maximizes channel separation in the downconverted signal $r_s(t)$ is given by:

$$f_{if}=\frac{\delta}{4}(2L+1) \quad (2)$$

where L is a non-negative integer. Choosing L=0 minimizes $f_{if}$, giving an optimal value of:

$$f_{ifopt}=\delta/4 \quad (3)$$

For example, for a channel separation ($\delta$) of 1 MHz, the optimal intermediate frequency, $f_{if}$, is 250 kHz. This low intermediate frequency allows the processor to employ low-frequency, low-cost components.

The optimal sampling frequency is given by:

$$f_s=\frac{4f_c-\delta}{4K} \quad (4)$$

where N is the number of channels in the received signal r(t), $\delta$ is the separation between channels, $f_c$ is the carrier frequency of the selected one of the channels; and, K is the largest integer k satisfying:

$$k \leq \frac{4(f_c/\delta)-1}{4N} \quad (5)$$

Other values of K may be chosen that satisfy the inequality given in Equation (7). However, choosing K as the largest integer k minimizes the sampling frequency, and thus reduces the cost of downconverter 42. In addition, requiring the sampling frequency to be larger than $N\delta$ ensures adequate separation between channels in the sampled signal $R_s(f_s)$.

Choosing an intermediate frequency of one-quarter the Channel separation ensures that each interleaved channel is centered between adjacent channels in the sampled spectrum $R_s(f)$. In other words, the separation between channels in $R_s(f)$ is equal to $\delta/2$, and is constant. If a slightly different intermediate frequency is chosen, e.g., $\delta/4+\epsilon$, interleaved channel 202 will be placed closer to one adjacent channel ($200_n$, $200_{n+1}$) than another. This will increase the likelihood of spectral distortion, especially when the bandwidth of each channel is relatively large.

The sampling aperture of the sample hold circuit 43 is chosen to be small in order to minimize mixer conversion loss and spectral distortion. The sampling aperture $\tau$ of the mixer is defined by the Fourier transform H(f) of its impulse response, given by:

$$H(f)=\tau\, \text{sinc}(f\tau)e^{-j\pi f\tau} \quad (6)$$

Receiver Channel Selector 46

The receiver channel selector 46 includes a divide by $D_s$ frequency divider 70 fed by the local oscillator 30 signal having the frequency, $f_r$, and a divide by $N_s$ frequency divider 72, arranged in a similar manner as the transmit channel selector 24. Thus, the output signals of the pair of frequency dividers 72, 70 are fed to a phase comparator 74, the output signal thereof providing the control signal for a voltage controlled oscillator (VCO) 76. The output of the VCO 76 is fed back to the divide by $N_s$ frequency divider 72 and serves as the receiver frequency channels selector (more specifically as the sampling signal for the sample hold circuit 43 in the down converter 42). Thus, in the steady state, the frequency of the signal produced by the divide by $N_s$ frequency divider 72, i.e., $f_s/N_s$, will be equal to $f_r/D_s$. That is, in the steady state, the sampling frequency, $f_s=(f_r)(N_s/D_s)$, here $20(N_s/D_s)$ MHz. As noted above, here:

$$f_s=\frac{4f_c-\delta}{4K}=\frac{4(f_c/\delta)-1}{4K}\delta \quad (7)$$

Thus, because here $\delta=1$ MHz and $f_c$ ranges from 2.401 GHz to 2.500 Ghz, here K=24. Further, because here the sampling frequency, $f_s$, is generated from the local oscillator having a frequency, $f_r$, here 20 MHz, $f_r=20\delta$:

$$f_s=\frac{4(f_c/\delta)-1}{80K}f_r=\frac{N_s}{D_s}f_r \quad (8)$$

Thus, here K=24 and $D_s$ is 1920 and $N_s$ is 9603, 9607, 9611, ... 9999, for tuning the receiver to channels 1 through 100, respectively.

As discussed above, the low pass filter 45 of the downconverter 42, as noted above, has a 480 KHz cutoff frequency and therefore selectively passing only those frequencies less than $\delta/2$, to demodulator 56 for demodulation after conversion to corresponding digital signals. Thus, low pass filter 45 passes only signals from the selected one of the frequency channels because the sample hold circuit 43 translates the frequencies of the signals in all unselected frequency channels to frequencies greater than $\delta/2$.

Voltage Controlled Oscillators 36, 38

Figure 3:
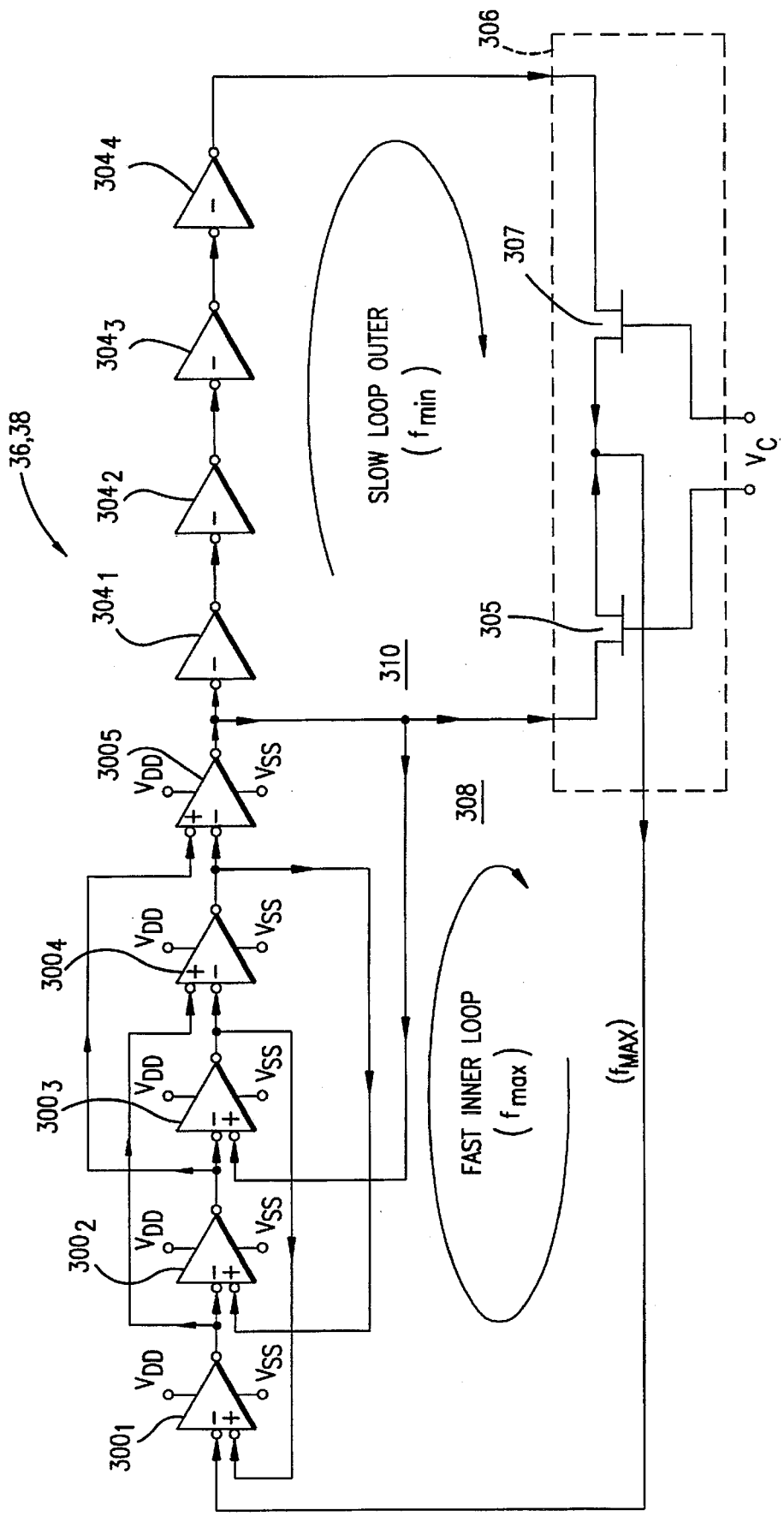
FIG. 3 is a block diagram of a voltage controlled oscillator (VCO) according to the invention, such VCO being used in the transceiver of FIG. 1.
Figure 4:
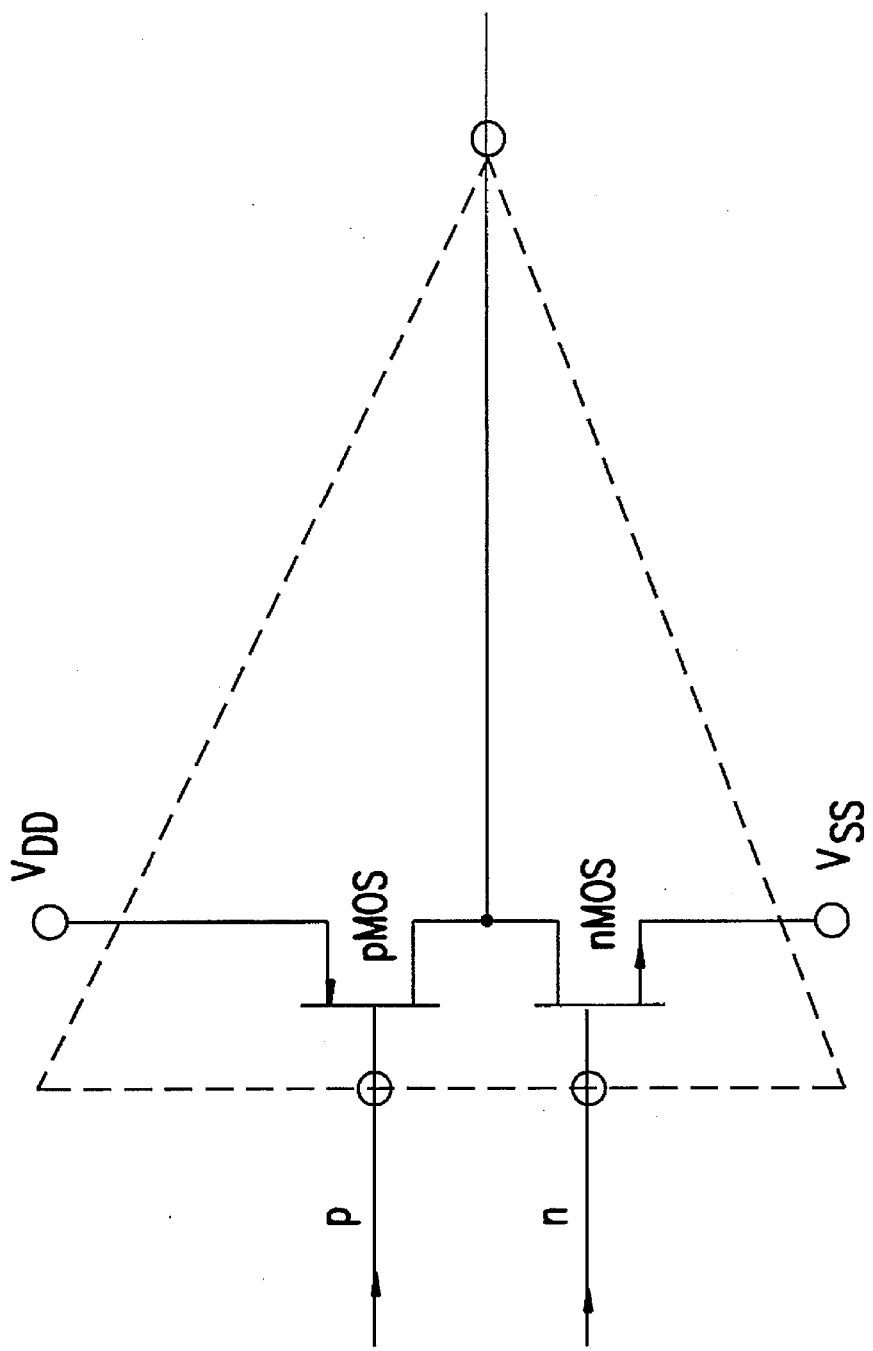
FIG. 4 is a schematic diagram of an inverter adapted for use in the VCO of FIG. 3.

Referring to FIGS. 3 and 4, VCO 36, 38 have a cascade of odd (n) and even (m) CMOS inverters $300_1$, ..., $300_n$ (here n=5) and $304_1$, ..., $304_m$ (here m=4). The number of odd (n) inverters $300_1$–$300_n$ is greater than the number of even (m) inverters $304_1$–$304_n$. An exemplary one of the inverters is shown in FIG. 4. Thus, each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. Each amplifier in the ring includes an n channel transistor (nMOS transistor) connected in a totem pole arrangement, to a p channel transistor (pMOS transistor). The gate of the nMOS transistor provides the non-inverting input and the gate of the pMOS transistor provides the inverting input. The source and drain paths of the pMOS and nMOS transistors are connected together to provide an output for the amplifier.

The outputs of the nth inverter $300_n$, here $300_5$, and the (n+m)th inverter $304_m$, here $304_4$, are connected to an interpolating circuit 306. The interpolating circuit 306 includes a pair of depletion mode field effect transistors 305, 307 arranged as a potentiometer to combine the signals produced in an inner, fast loop 308 and a slower outer loop 310. That is, the cascade of n inverters thus forms an inner ring 308, and the cascade of (n+m) inverters forms an outer ring 310.

The total propagation delay through inner ring 308 determines a highest frequency of oscillation of VCOs 36, 38, i.e., a longer delay in each inverter 300 or a larger number of inverters 300 decreases the maximum frequency of oscillation of VCOs 36, 38. Similarly, the total propagation delay through outer ring 310 (including all n+m inverters) determines a lowest frequency of oscillation of VCOs 36, 38.

Circuit 306 produces a weighted vector sum of the signals at the output of the nth inverter $300_n$ and the (n+m)th inverter $304_m$ to control the total propagation delay through VCOs 38, 76, and thus the frequency of oscillation, in response to a control voltage. VCOs 38, 76 are preferably designed to oscillate between 700 MHz and 1 GHz.

Referring to FIG. 4, each inverter 300, 304 includes a relatively slow, pMOS transistor and a relatively fast NMOS transistor. As shown, in order to increase the highest frequency of oscillation without decreasing the number of inverters, VCOs 38, 76 include a look-ahead mechanism. In the inner ring of n inverters $300_1, \ldots, 300_n$, the output of each inverter is fed forward by two, or more generally, an even number of stages. In other words, the output of each inverter is fed into the n-input, or gate of the nMOS transistor, of the successive inverter, and the gate of the pMOS transistor in such inverter in the inner ring is fed by a signal an even number of stages before it. In the example shown, five stage inner ring 308 in VCOs 38, 76 has a two stage look-ahead. This drives the relatively slow pMOS gate 350 of each inverter in anticipation of the faster response in nMOS gate 352, and decreases the total propagation delay of inner ring 308.

More specifically, the output of inverter $300_1$ is fed to the n-input of inverter $300_2$ and to the p-input of inverter $300_4$. The output of inverter $300_2$ is fed to the n-input of inverter $300_3$ and to the p-input of inverter $300_5$. The output of inverter $300_3$ is fed to the n-input of inverter $300_4$ and to the p-input of inverter $300_1$. The output of inverter $300_4$ is fed to the n-input of inverter $300_5$ and to the p-input of inverter $300_2$. The output of inverter $300_5$ is fed, via the circuit 306, to the n-input of inverter $300_1$ and to the p-input of inverter $300_3$.

To put it still another way, each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. Each amplifier in the ring includes an n channel transistor (nMOS transistor) connected in a totem pole arrangement, to a p channel transistor (pMOS transistor). The gate of the nMOS transistor provides the n-input and gate of the pMOS transistor provides the p-input. The source and drain paths of the pMOS and nMOS transistors are connected together to provide an output for the amplifier. With such arrangement, because the gate of the more slowly responding pMOS transistor is driven before the gate of the nMOS transistor the oscillator is adapted to operate at a higher frequency of oscillation. That is, one input of the differential amplifier is driven prematurely.

Figure 5:
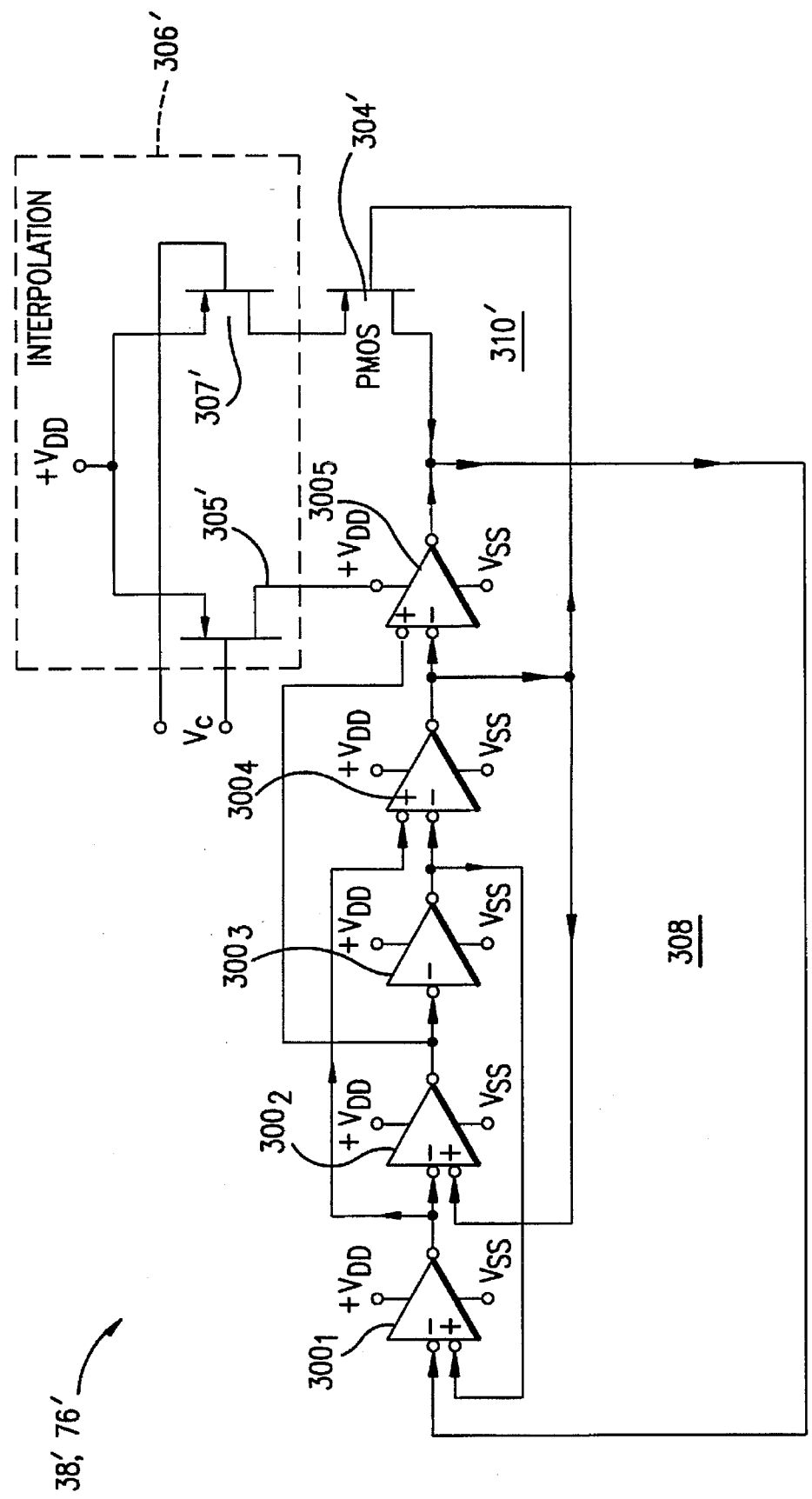
FIG. 5 is a block diagram of a VCO according to an alternative embodiment of the invention, such VCO being adapted for use in the transceiver of FIG. 1.

Alternatively, as shown in FIG. 5, in VCOs 38', 76' the outer loop 310' instead of having an even number of cascaded inverters $304_1$–$304_4$, as in VCOs 38, 76 (FIG. 4), has a pMOS transistor 304', as shown. The pMOS transistor 304' is not connected as an inverter but rather shares the nMOS transistor of inverter $300_5$. The drain of the pMOS transistor in inverter $300_5$ and the drain of pMOS transistor 304' are coupled to the interpolation circuit 306' as shown. Circuit 306' includes a pair of field effect transistors 305', 307', having their sources connected, respectively, to the drain of the pMOS transistor of inverter $300_5$ and the drain of pMOS transistor 304'. Thus, instead of creating a difference in delay between the two rings by providing a different number of inverters in each ring (as in VCOs 38, 76), the delay in the two rings is modified by slow transistor 304' and the fast nMOS transistor in inverter $300_5$. Interpolator 306 mixes the outputs in response to a control voltage fed to the gates of transistors 305', 307 to vary the frequency of oscillation of VCOs 38', 76'. VCOs 38', 76' thus provide a higher maximum frequency than VCO 38, 76 by removing the two inverters in the outer ring of VCOs 38, 76 that capacitively load the five inverters in the inner ring.

The look-ahead mechanism can be used to increase the maximum frequency of oscillation in any ring oscillator with components having differential delays.

Low Pass Filter 45

Figure 6A:
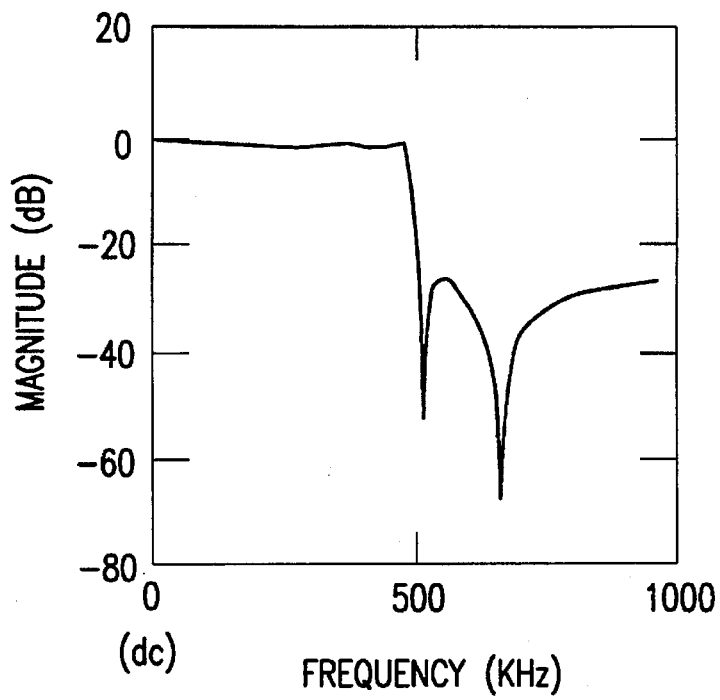
FIGS. 6A, 6B and 6C are the frequency spectrum, time delay and step response characteristics of a low pass filter used in the downconverter of the transceiver of FIG. 1.
Figure 6B:
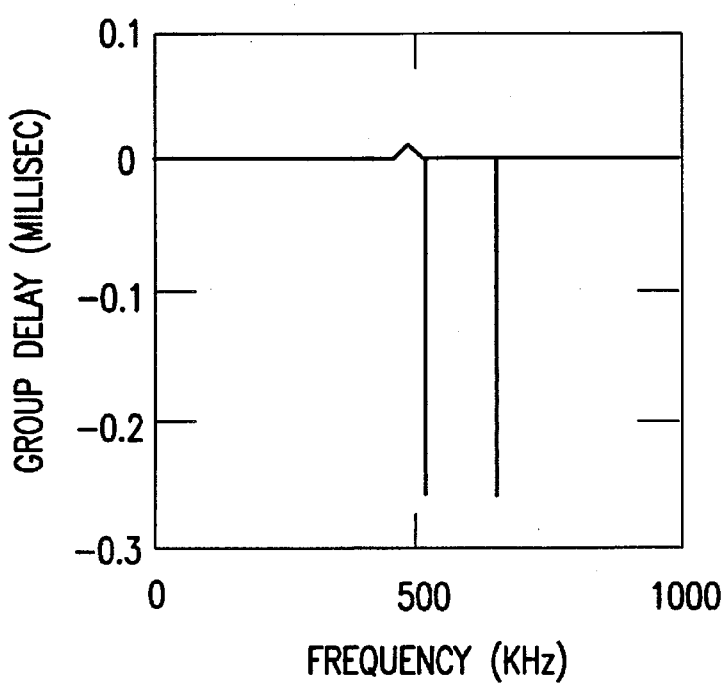
Figure 6C:
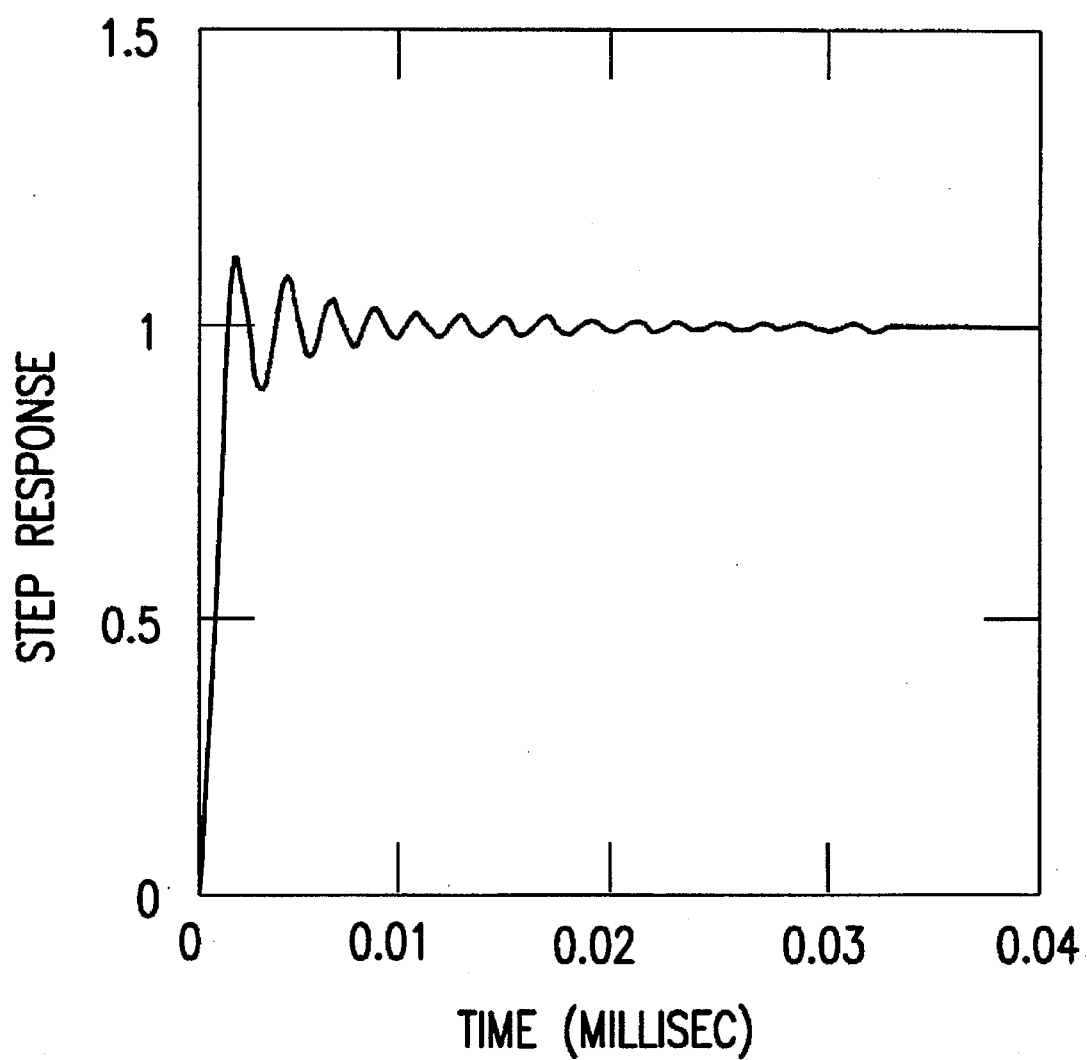

Referring to FIGS. 6A through 6C, the frequency spectrum, group delay, and step response of low pass filter 45 (FIG. 2) are shown, respectively. The frequency spectrum is centered at dc and has here a bandwidth of 480 MHz to isolate the frequency channel of interest, i.e., the selected channel downconverted to the intermediate frequency, $f_{if}$= 250 MHZ. The low pass filter is an elliptic filter with 1 dB in-band ripple, a 480 kHz 3 dB bandwidth, and a stopband (with greater than or equal to 25 dB rejection) of 520 kHz.

A MATLAB program for designing and analyzing the filter is given in Appendix A. The output $r_i(t)$ of the filter is approximately equal to the bandpass signal $r_s(t)$ shifted to $f_{if}$ and scaled by the gain of the low pass filter.

Low Noise Amplifier 40 and Coarse AGC Circuit 48

Referring to FIG. 1, low noise amplifier 40 and coarse AGC circuit 48 together adjust the gain of the signal, $a_n$, produced at the output of coarse AGC circuit 54 in 3 dB steps, to maintain the received energy within the transceiver's dynamic range of 60 dB. More particularly, AGC control 58 and low pass filter 57, shown in detail in FIG. 7, produce a signal on line 61 to cause coarse AGC 48 and amplifier 40 to adjust the gain of the received signal by one step in the appropriate direction when power of the signal, v(n), produced by the Hilbert-Transform-pair demodulator 56 is outside the dynamic range of fine AGC circuit 54.

Coarse AGC circuit 48 and amplifier 40 thus minimize the effect of quantization noise and prevent arithmetic overflow (due to too large signals) in digital signal processor 50. Coarse AGC circuit 48 and ADC 53 are synchronized to different phases of the reference frequency ($f_r$) to ensure adequate settling time for coarse AGC circuit 48 and amplifier 40.

Analog to Digital Converter (ADC) 52

The ADC conversion rate exceeds $2f_b+\delta/2$, where $\delta$ is the adjacent channel separation in R(f) (e.g., 1 MHz), and $2f_b$ is the bandwidth of each channel 200 (FIG. 2A). The ADC 52 preferably has a conversion rate of 1 MHz. This ensures that the conversion rate is larger than twice the highest frequency component in its input $r_i(t)$, or the Nyquist frequency.

Referring to FIG. 1, the sampling frequency is provided to ADC 52 by divider 53 dividing the reference frequency (20 MHz) from oscillator 30 by 20. The ADC 52 also preferably encodes signal samples in a 2's complement format in 10 bits or more. A 10 bit ADC has a quantization signal to noise ratio (SNR) of better than 55 dB, which is adequate. All subsequent operations in DSP 50 maintain a 10 bit accuracy in 2's complement format to match ADC 52. All numbers are represented in fixed point fractional format in the range [−1,1).

Fine AGC Circuit 54

Figure 7:
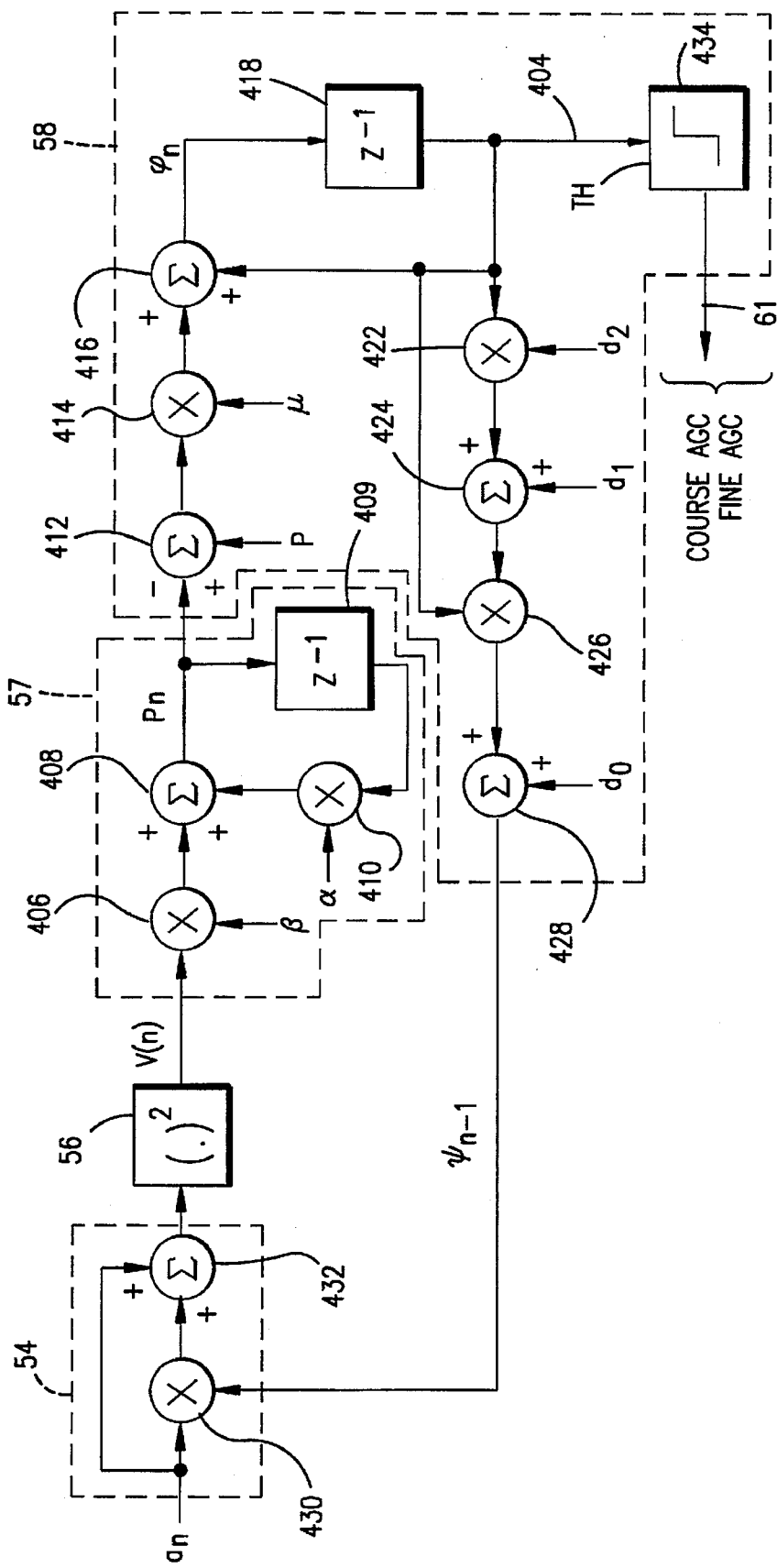
FIG. 7 is a diagram useful in understanding the operation of coarse and fine automatic gain control (AGC) circuits used in the transceiver of FIG. 1.

Referring to FIGS. 1 and 7, fine AGC circuit 54 causes the power in the signal, v(n), produced by the Hilbert-Transform-pair Demodulator 56 to track a constant reference value P, and thus minimizes the effect of arithmetic truncation errors in the Hilbert-Transform-pair demodulator 56.

Fine AGC circuit 54 multiplies digitized output $a_n$ of the ADC 52 by a factor $\lambda_{n-1}$. A low pass filter 57 calculates the resulting average energy $P_n$ from the output v(n) of the Hilbert-Transform-pair demodulator 56. The fine AGC control 58 then iteratively adapts $\lambda$ to cause the average energy $p_n$ to track a constant reference P. The iterative solution avoids computational problems associated with fixed point division (e.g., inefficiency and numeric overflow) in determining the scaling factor ($\lambda_n=p/P_n$).

Because DSP 50 (FIG. 1) functions in fixed point arithmetic in the range [−1,1), the gain $\lambda$ is transformed as follows:

$$\lambda_n \in [\sqrt{0.5}, \sqrt{2}) \qquad (9)$$

$$\lambda_n = 1 + \psi_n; \sqrt{0.5} - 1 \leq \psi_n < \sqrt{2} - 1$$

$$1 + \phi_n = (1 + \psi_n)^2; -0.5 \leq \phi_n < 1$$

The gain $\lambda$ is thus limited to 3 dB.

Referring to FIG. 7, low pass filter 57 has a multiplier 406 multiplying v(n) by a factor $\beta$. The output of multiplier 406 is coupled to an adder 408. The output of the adder 408 is fed back through a one-cycle delay 409 and a multiplier 410 multiplying its input by $\alpha$. The output $p_n$ of the low pass filter 57 is thus:

$$p_n=\alpha p_{n-1}+\beta v_n \qquad (10)$$

The factors $\alpha$ and $\beta$ are stored in RAM 25 by microprocessor 18 (FIG. 1).

The average power $p_n$ is fed to an adder 412 that subtracts $p_n$ from the constant reference power P to generate an error signal. The output of adder 412, the error signal, is then multiplied by the step size of the iteration, $\mu$, in multiplier 414. The step size and the reference power P are stored in RAM 25 by microprocessor 18 (FIG. 1).

An adder 416 sums the output of multiplier 414 with a delayed output $\phi_{n-1}$ of adder 416 from delay 418 to produce:

$$\phi_n = \phi_{n-1} + \mu(P - p_n), -0.5 \leq \phi_n < 1 \qquad (11)$$

where:

$$\psi_n = \lambda_n - 1 = \sqrt{1+\phi_n} - 1 \qquad (12)$$

Next, $\psi_{n-1}$ is computed from $\phi_{n-1}$ with a polynomial approximation using the least-square technique. Multiplier 422 multiplies the output of delay 418 ($\psi_{n-1}$) by $d_2$, and adder 424 sums the output of multiplier 422 with $d_1$. The output of adder 424 is then multiplied by the output of delay 418 in multiplier 426, and summed with $d_0$ in adder 428. The output of adder 428 is $\psi_{n-1}$, given by:

$$\psi_{n-1} = d_2\phi_{n-1}^2 + d_1\phi_{n-1} + d_0 \approx \sqrt{1+\phi_n} - 1, \qquad (13)$$
$$-0.5 \leq \phi_n < 1$$

where $$d_2 = -.2025847; d_1 = 0.565846; d_0 = 0.0102634 \qquad (14)$$

The constants in Equation (13) are all stored in RAM 25 by microprocessor 18.

The fine AGC circuit 54 calculates $\lambda_{n-1}$ from $\psi_{n-1}$ by multiplying $a_n$ by $\psi_{n-1}$ in multiplier 430, and adding $a_n$ to the output of multiplier 430 in adder 432.

The AGC component 404, i.e., the output of delay 418, (i.e., $\phi_{n-1}$) is compared with a predetermined threshold level, TH, in threshold device 434. When threshold device 434 determines that $\phi_{n-1}$ exceeds the predetermined threshold level, TH, indicating that P differs from $P_{n-1}$ by more than 3 dB, an AGC component signal is produced on line 61 by the threshold device 434 to inform coarse AGC 78 and amplifier 69 to adjust the gain of the received signal by 3 dB in the appropriate direction. AGC component 404 then resets parameter $\psi_{n-1}$ to zero, and the gain $\lambda$ is iteratively readjusted to the new received power $p_n$.

The approximation error in calculating $\psi_{n-1}$ with Equation (15) is no more than 2% over the entire interval of interest. In addition, $\psi_{n-1}$ is guaranteed to converge as long as the power $p_n$ varies slowly relative to the time of convergence of fine AGC circuit 54, i.e., the received data $a_n$ is approximately wide-sense stationary.

Hilbert-Tranform-Pair Filter Section 55

Figure 8:
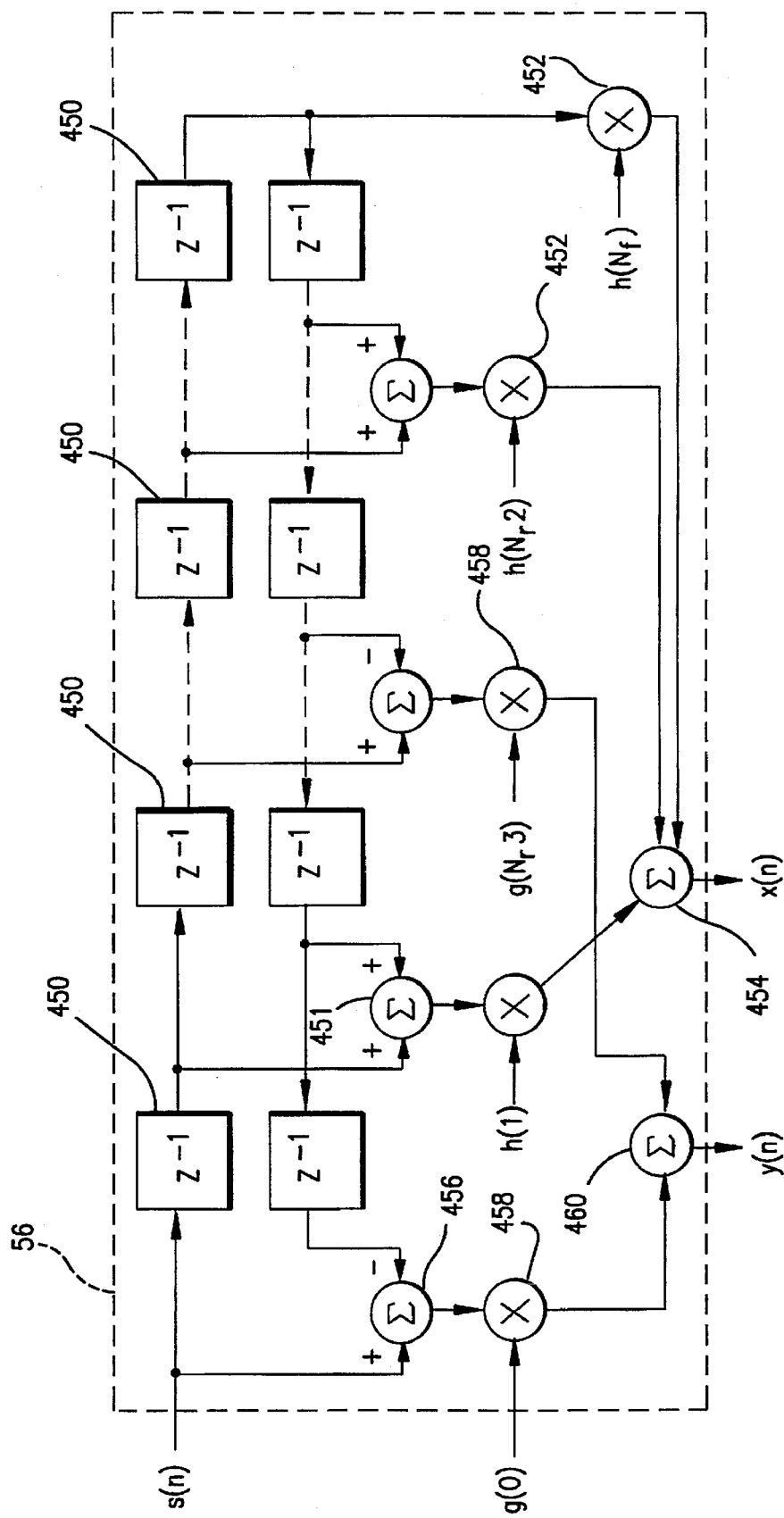
FIG. 8 is a diagram showing a Hilbert-Transform-pair filter section used in the transceiver of FIG. 1.

Referring now to FIG. 8, Hilbert-transform-pair filters 92, 94 of section 55 (FIG. 1) are each finite impulse response (FIR) filters with bandwidth $$[f_1, f_h]=[f_{if}-(f_b+80kHz), f_{if}+(f_b+80kHz)] \qquad (15)$$

where $2f_b$ is the bandwidth of each individual channel 200 in the spectrum R(f) of the received signal r(t) (FIG. 2A). Hilbert-transform-pair filters 92, 94 in filter section 55 thus account for an 80 kHz error range in the downconversion of the bandpass spectrum to $f_{if}$. In other words, the Hilbert-transform-pair preserves information that is shifted from the intermediate frequency by 80 kHz plus half the channel bandwidth.

Filters 92, 94 have 2Nf+1 tap coefficients h(n), g(n), given by:

$$h(n) = 2b\,\text{sinc}[(n-N_f)b]\cos[2\pi(n-N_f)d]w(n-N_f) \quad (16)$$

$$g(n) = 2b\,\text{sinc}[(n-N_f)b]\sin[2\pi(n-N_f)d]w(n-N_f) \quad (17)$$

where $$0 \leq n \leq 2N_f \quad (18)$$

$$b = \frac{f_h - f_1}{f_p}\; ;\; d = \frac{f_h + f_1}{2f_p} = \frac{f_{if}}{f_p}$$

and $f_p$ is the sampling rate of ADC 80. The Hamming window w(m) is given by:

$$w(m) = 0.54 + 0.46\cos\frac{m\pi}{N_f}\; ;\; |m| \leq N_f \quad (19)$$
$$= 0;\text{ elsewhere}$$

The Hamming window smooths the magnitude response of the Hilbert-transform-pair filters 92, 94 to eliminate passband ripples due to the well-known Gibb's phenomenon.

When the optimal intermediate frequency ($f_{if} = \delta/4$) is used at a sampling rate of $f_p = 4f_{if} = 1$ MHz, the tap coefficients reduce to:

$$h(n) = (-1)^k 2b\,\text{sinc}(2kb)w(2k);\, n = N_f + 2k; \quad (20)$$
$$-\frac{N_f}{2} \leq k \leq \frac{N_f}{2}$$
$$= 0;\text{ elsewhere}$$

$$h(n) = h(2N_f - n);\, 0 \leq n \leq 2N_f$$

$$g(n) = (-1)^{k+1} 2b\,\text{sinc}[(2k-1)b]w(2k-1); \quad (21)$$
$$n = N_f + 2k - 1;$$
$$\frac{1-N_f}{2} \leq k \leq \frac{1+N_f}{2}$$
$$= 0;\text{ elsewhere}$$

$$g(n) = -g(2N_f - n);\, 0 \leq n \leq 2N_f$$

As shown in FIG. 8, at the optimal intermediate frequency and with Nf odd, Hilbert-transform-pair filters 92, 94 share $2N_f$ cascaded delays 450. Outputs of the delays are summed in adders 451 and multiplied by the appropriate tap coefficient h(n) in multipliers 452. The outputs of multipliers 452 are summed in adder 454 to produce the output x(n) of filter 92. Outputs of the delays 450 are also summed in adders 456 multiplied by the appropriate tap coefficient g(n) in multipliers 458. The outputs of adders 456 are summed in adder 460 to produce the output y(n) of filter 94.

The in-phase and quadrature outputs x(n), y(n) are thus:

$$x(n) = h(N_f)s(n - N_f) + \sum_{k=1}^{K} h(N_f + 2k)[s(n - N_f - 2k) + s(n - N_f + 2k)] \quad (22)$$

where K is the largest integer less than or equal to $N_f/2$, and $$y(n) = \sum_{k=1}^{L} g(N_f + 2k - 1)[s(n - N_f - 2k + 1) - s(n - N_f + 2k - 1)] \quad (23)$$

where L is the largest integer less than or equal to $(N_f+1)/2$.

In a one-micron CMOS implementation of filters 92, 94, it is estimated that only $(N_f+1)/8$, 10-bit multipliers are employed. This is because each multiplier performs a multiplication in about 125 ns, and the sampling interval is 1 microsecond. For example, for Hilbert-transform-pair filters with 31 tap coefficients ($N_f=15$), only one multiplier per filter is needed. Similarly, $2N_f-1$ additions are performed in the filter operations.

Figure 9A:
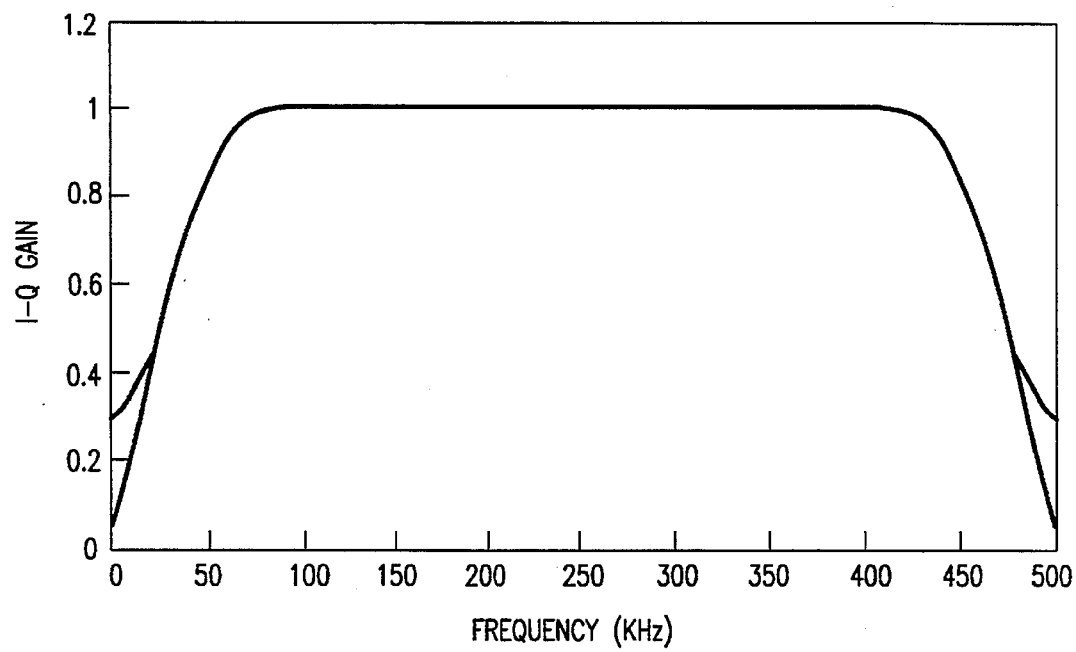
FIGS. 9A and 9B are graphs representing the gain and relative phase as a function of frequency of the filters of FIG. 8; and, FIGS. 10A through 10C, are the Fourier transforms X'(f), Y'(f) of the outputs of the Hilbert-Transform-pair filter section.
Figure 9B:
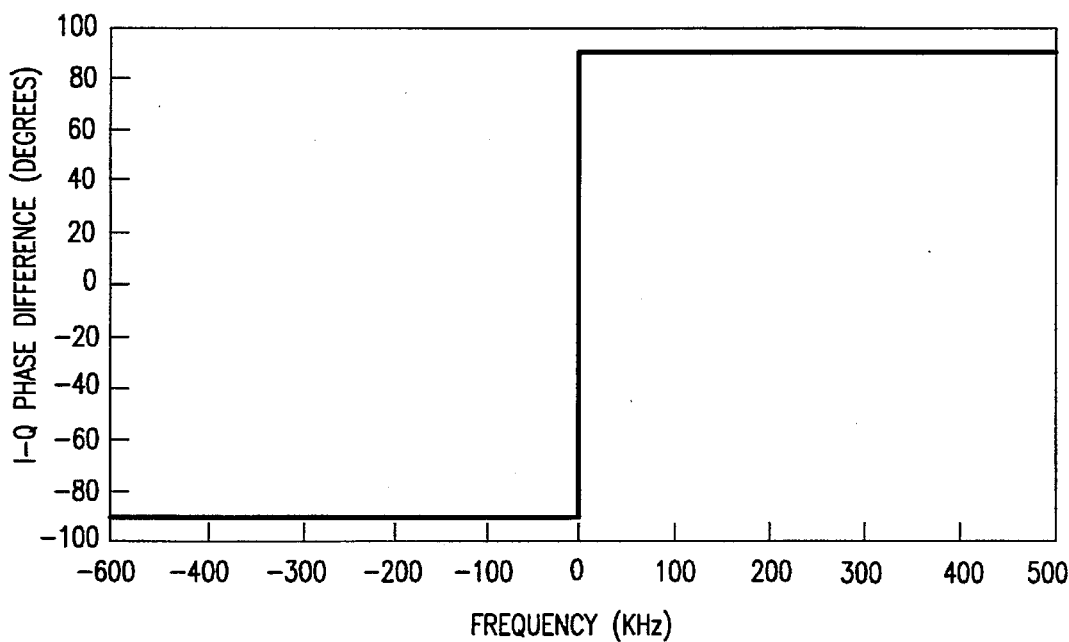

Referring to FIGS. 9A and 9B, filters 92, 94 have matched in-band magnitudes and are +90 degrees out of phase for positive frequencies and −90 degrees out of phase for negative frequencies. Any imbalance in the magnitude of the filters is less than −40 dB. Filters 92, 94 achieve a worst-case stopband rejection (at a 256 kilobits per second data rate) of at least 10 dB. Together with low pass filter 76, the total worst-case adjacent channel rejection exceeds 35 dB.

Figure 10A:
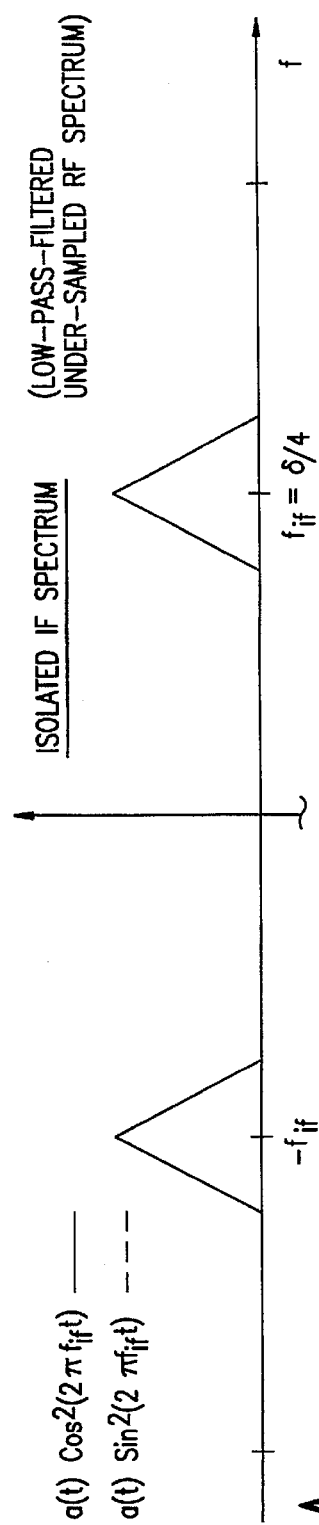
Figure 10B:
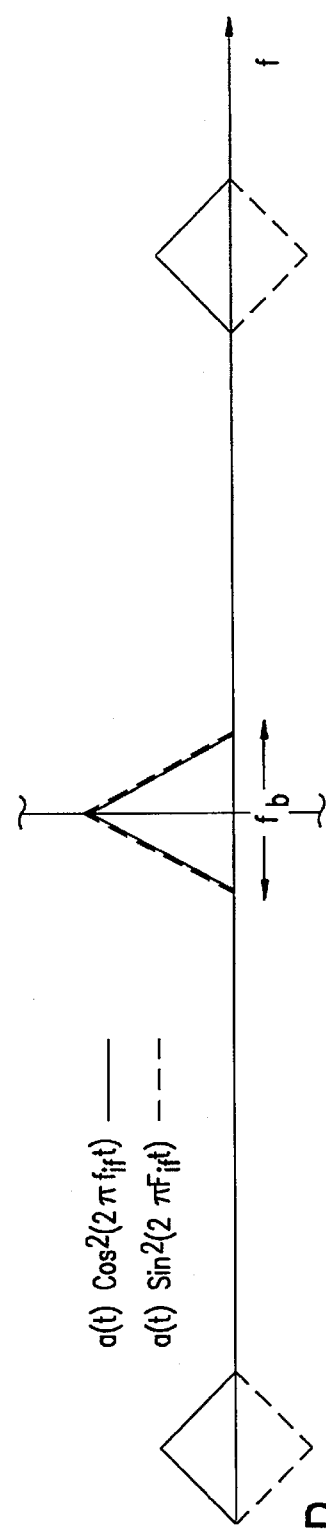
Figure 10C:
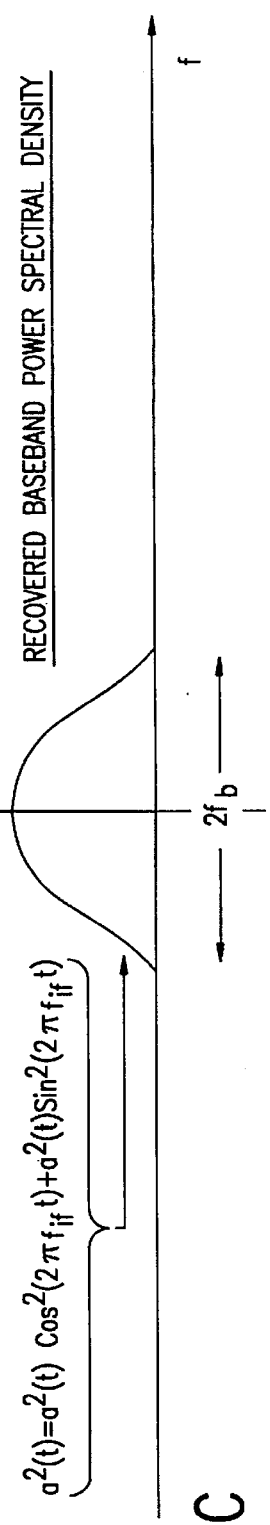

Referring to FIGS. 10A through 10C, an analog representation of the Fourier transforms X'(f), Y'(f) of the square of the filter outputs, $x^2(n)$ and $y^2(n)$ indicates schematically that the outputs are normal vector components of the magnitude of s(n). Squaring and adding the outputs thus produces the baseband power in s(n) (equal to v(n)).

A MATLAB program for the design and analysis of filters 92, 94 is given in Appendix B.

Other embodiments are within the spirit and scope of the appended claims. For example, fine AGC circuit 54 can be designed to adjust the gain to within more than 3 dB, e.g., with a gain $\lambda=\psi+1+1$, with additional adders. Fine AGC circuit 54 could also be implemented in a floating point digital signal processor, at a greater cost. Further, the inner loop 308 may be used without outer loop 310 to provide a ring oscillator without voltage control.

Appendix A

1. MATLAB Program

```
%
%     DESIGN/ANALYZE: Analog Low-Pass Elliptic Filter to Isolate the IF Spectrum.
%
% INPUT DATA FILE   = "IFLPF.SPC"
%     (1) fp     = IFLPF(1) : Passband corner frequency  (Hz)
%     (2) fs     = IFLPF(2) : Stopband cutoff frequency  (Hz)
%     (3) Mp     = IFLPF(3) : Maximum passband ripple    (dB)
%     (4) Ms     = IFLPF(4) : Minimum stopband rejection (dB)
%     (5) Gain   = IFLPF(5) : In-band gain               (dB)
%
% OUTPUT DATA FILE  = "IFLPF.DES"
%     (1) Poles-Zero constellation.
%     (2) Scaling to achieve specified "Gain"
%     (3) Decomposition into biquadratic and first-order sections.
%

%
casesen on;
clear;
%
% *************** Read Input Data and Convert to Useful Information **********
%
load iflpf.spc;
fp    = iflpf(1);              % Passband frequency
fs    = iflpf(2);              % Stopband frequency
Mp    = iflpf(3);              % Passband ripple
Ms    = iflpf(4);              % Stopband rejection
Gain  = 10.^(iflpf(5)/20);     % In-band gain
funny = 1.0e12;                % Hard-to-explain MATLAB idiosyncracy
%
% *************** Determine Minimum Filter Order ****************************
%
[N,W] = ellipord(fp/funny,fs/funny,Mp,Ms);
W = W*funny;
%
% *************** Compute Normalized Pole-Zero Constellation *****************
%
[z,p,k]=ellipap(N,Mp,Ms);
%
% *************** Format Output File IFLPF.DES *******************************
%
delete iflpf.des;
fprintf('iflpf.des','DESIGN SUMMARY:\n\n');
fprintf('iflpf.des','Passband Corner Frequency (Hz) = %-10.8e\n',fp);
fprintf('iflpf.des','Stopband Cutoff Frequency (Hz) = %-10.8e\n',fs);
fprintf('iflpf.des','Passband Ripple       (dB) = %-4.2f\n',Mp);
fprintf('iflpf.des','Stopband Rejection    (dB) = %-4.2f\n',Ms-Mp);
```

```
fprintf('iflpf.des','In-Band Gain           (dB) = %-4.2f\n',iflpf(5));
fprintf('iflpf.des','Filter Order                = %-2i\n',N);
fprintf('iflpf.des','Filter Type                 = Low-Pass Elliptic\n\n');
fprintf('iflpf.des','RESULTS\n\n').
%
% ************** Compute and Save Output to IFLPF.DES ************************
%
% --------------- Denormalized Pole-Zero Constellation ------------
dz = 2*pi*W*z;                      % Denormalize zeros
dp = 2*pi*W*p;                      % Denormalize poles
dk = k*((2*pi*W)^(length(p)-length(z)))   % Adjust scaling factor
%
fprintf('iflpf.des','     Poles (Radians/s)           Zeros (Radians/s)    n');
fprintf('iflpf.des','     Real     Imaginary       Real     Imaginary\n');
for i=1:length(z)
    fprintf('iflpf.des','\n');
    fprintf('iflpf.des','%+7.5e    ',real(dp(i)),imag(dp(i)),real(dz(i)),imag(dz(i)));
end;
for i=length(z)+1:length(p)
    fprintf('iflpf.des','\n');
    fprintf('iflpf.des','%+7.5e    ',real(dp(i)),imag(dp(i)));
end;
fprintf('iflpf.des','\n\nScaling Factor = %+7.5e\n\n',dk*Gain);
%
% ------------ Filter Decomposition ------------------
section = decomp(dz,dp,Gain);
%
fprintf('iflpf.des','DECOMPOSITION\n\n');
[n,m]=size(section);
for i=1:n/2,
    l=i+n/2;
    fprintf('iflpf.des','          Section %2i\n\n',i);
    if section(l,1)~=0,
        fprintf('iflpf.des','Natural frequency    Damping Factor    Gain\n');
        omega = sqrt(section(l,3)/section(l,1));
        zeta  = 0.5*section(l,2)/omega;
        fprintf('iflpf.des','%+7.5e    ',omega,zeta,section(i,3)/section(l,3));
    elseif section(l,2)~=0,
        fprintf('iflpf.des','Natural frequency                      Gain\n');
        omega = section(l,3)/section(l,2);
        fprintf('iflpf.des','%+7.5e    ',
                omega,section(i,3)/section(l,3));
    end
    fprintf('iflpf.des','\n');
    if section(i,1)~=0,
        omega = sqrt(section(i,3)/section(i,1));
        zeta  = 0.5*section(i,2)/omega;
        fprintf('iflpf.des','%+7.5e    ',omega,zeta);
    elseif section(i,2)~=0,
        omega = section(i,3)/section(i,2);
        fprintf('iflpf.des','%+7.5e    ',omega);
    end
    fprintf('iflpf.des','\n\n');
end
```

```
%
% ************** Plot Frequency Response ************************************
%
decade = fix(log10(W)/3);
if    decade == 0
        funit = setstr('Frequency (Hz)');
        dunit = setstr('Group Delay (sec)');
        sunit = setstr('Time (sec)');
elseif decade == 1
        funit = setstr('Frequency (KHz)'),
        dunit = setstr('Group Delay (millisec)');
        sunit = setstr('Time (millisec)');
elseif decade == 2
        funit = setstr('Frequency (MHz)');
        dunit = setstr('Group Delay (microsec)');
        sunit = setstr('Time (microsec)');
elseif decade >= 3
        decade = 3;
        funit = setstr('Frequency (GHz)');
        dunit = setstr('Group Delay (nanosec)');
        sunit = setstr('Time (nanosec)');
end;
%
w = linspace(0,2.0,500);
h = freqs(Gain*k*poly(z),poly(p),w)
mag = 20*log10(abs(h));
phase = unwrap(angle(h));
delay = -diff(phase)./diff(w);
delay = [delay,delay(499)]*(10.^(3*decade))/(2*pi*W);
f = W * w/(10.^(3*decade));
data = [f' mag' delay'];
save iflpf.dat data /ascii;
subplot(221), plot(f,mag);
xlabel(funit);
ylabel('Magnitude (dB)');
grid;
subplot(222), plot(f,delay);
xlabel(funit);
ylabel(dunit);
grid;
t = linspace(0,100,500);
[y x]=step(k*poly(z),poly(p),t);
t = t * (10.^(3*decade))/(2*pi*W);
subplot(223), plot(t,y);
xlabel(sunit);
ylabel('Step Response');
grid;
%
```

2. Design Summary

Passband Corner Frequency (Hz) = 4.80000000e+005
Stopband Cutoff Frequency (Hz) = 5.20000000e+005
Passband Ripple         (dB)   = 1.00
Stopband Rejection      (dB)   = 25.00
In-Band Gain            (dB)   = 0.00
Filter Order                   = 5
Filter Type                    = Low-Pass Elliptic

RESULTS:

| Poles (Radians/s) | | Zeros (Radians/s) | |
|---|---|---|---|
| Real | Imaginary | Real | Imaginary |
| -5.68391e+005 | -2.53891e-006 | -0.00000e+000 | -4.14025e+006 |
| -5.68391e+005 | -2.53891e+006 | +0.00000e+000 | +4.14025e+006 |
| -8.08894e+004 | -3.01877e+006 | -0.00000e+000 | -3.25509e+006 |
| -8.08894e+004 | -3.01877e+006 | +0.00000e+000 | -3.25509e+006 |
| -1.47700e+006 | -0.00000e+000 | | |

Scaling Factor = +5.02002e+005

DECOMPOSITION:

Section 1

| Natural frequency | Damping Factor | Gain |
|---|---|---|
| +2.60176e+006 | +2.18464e-001 | +1.00000e+000 |
| +3.25509e+006 | +0.00000e+000 | |

Section 2

| Natural frequency | Damping Factor | Gain |
|---|---|---|
| +3.01985e+006 | +2.67859e-002 | +1.00000e+000 |
| +4.14025e+006 | +0.00000e+000 | |

Section 3

| Natural frequency | Gain |
|---|---|
| +1.47700e+006 | +1.00000e+000 |

Appendix B

Hilbert-Transform-Pair FIR Filters

1. MATLAB Program

```
%
%========================================================================
%
%   DESIGN/ANALYZE: Hilbert-Transform-Pair FIR Filters (ODD order).
%             Use the Hamming Window to Suppress In-Band Ripples.
%
% INPUT DATA FILE  = "HILBERT.SPC"
%   (1) f_s    = HILBERT(1) : Sampling frequency       (Hz)
%   (2) f3dB_l = HILBERT(2) : Low 3-dB cutoff frequency  (Hz)
%   (3) f3dB_h = HILBERT(3) : High 3-dB cutoff frequency (Hz)
%   (4) gain   = HILBERT(4) : In-band gain             (dB)
%   (5) N_0 +1 = HILBERT(5) : Filter order             (taps)
%   (6) p      = HILBERT(6) : Fixed-Point Precision    (bits)
%   (7) n_p    = HILBERT(7) : Number of points for analysis
%
% OUTPUT DATA FILE = "HILBERT.TAP"
%   (1) h(n)    :  Filter tap coefficients (Real)
%   (2) h_fpp(n):  Fixed-point-precision tap coefficients (Real)
%   (3) h_tap(n):  n-bit binary tap coefficients (Real)
%   (4) g(n)    :  Filter tap coefficients (Imaginary)
%   (5) g_fpp(n):  Fixed-point-precision tap coefficients (Imaginary)
%   (6) g_tap(n):  n-bit binary tap coefficients (Imaginary)
%
% OUTPUT DATA FILE = "HILBERT.PLT"
%   (1) H(f)    :  Denormalized frequency response (Real)
%   (2) G(f)    :  Denormalized frequency response (Imaginary)
%
%========================================================================
%
%
casesen on;
clear;
%
% *************** Read Input Data and Convert to Useful Information *********
%
load hilbert.spc;
f_s   = hilbert(1);                % Sampling frequency
n_bar = (hilbert(5)-1)/2;          % (Filter order - 1)/2
b     = (hilbert(3)-hilbert(2))/f_s;    % Normalized 3-dB bandwidth
d     = (hilbert(3)+hilbert(2))/(2*f_s); % Normalized center frequency
k     = (-n_bar):(n_bar)           % Odd-order FIR's only
gain  = 10.^(hilbert(4)/20)        % In-band gain
p     = hilbert(6)                 % Fixed-point precision
n_p   = hilbert(7)                 % Number of Points for
                                   % frequency-domain analysis
%
% *************** Tap Coefficients with Floating-Point Precision *************
%
```

```
common = gain * (2*b) * ( sinc(b*k) .* hamming(hilbert(5))');
h = common .* cos(2*pi*d*k);
g = common .* sin(2*pi*d*k);
%
% ************** Tap Coefficients with Fixed-Point Precision ****************
%
h_fpp = round2fp(h,p);
g_fpp = round2fp(g,p);
%
% ************** Tap Coefficients in 2's-Complement Fixed-Point Format ******
%
h_tap = dec2fp(h_fpp,p);
g_tap = dec2fp(g_fpp,p);
%
% ************** Format Output File HILBERT.TAP *****************************
%
delete hilbert.tap;
fprintf('hilbert.tap','DESIGN SUMMARY:\n\n');
fprintf('hilbert.tap','Sampling Frequency    (Hz) = %-10.8e\n',hilbert(1));
fprintf('hilbert.tap','Low Cut-Off Frequency (Hz) = %-10.8e\n',hilbert(2));
fprintf('hilbert.tap','High Cut-Off Frequency (Hz) = %-10.8e\n',hilbert(3));
fprintf('hilbert.tap','Filter Center Frequency (Hz) = %-10.8e\n',d*f_s);
fprintf('hilbert.tap','Filter Bandwidth      (Hz) = %-10.8e\n',b*f_s);
fprintf('hilbert.tap','In-Band Gain          (dB) = %-5.2f\n',hilbert(4));
fprintf('hilbert.tap','FIR Filter Order      (Taps) = %-2i\n',hilbert(5));
fprintf('hilbert.tap','Window                = %-2i-point Hamming\n',hilbert(5));
fprintf('hilbert.tap','Fixed-Point Precision (Bits) = %-2i\n\n',hilbert(6));
fprintf('hilbert.tap','RESULTS:\n\n');
%
% ************** Format and Save In-Phase Taps to HILBERT.TAP **************
%
iphase = [h' h_fpp'];
itap   = h_tap';
fprintf('hilbert.tap','   In-Phase Channel Tap Coefficients\n');
fprintf('hilbert.tap','Floating-Point    Fixed-Point    Binary\n');
for i=1:hilbert(5)
   fprintf('hilbert.tap','\n');
   fprintf('hilbert.tap','%-12.10f    ',iphase(i,:));
   fprintf('hilbert.tap',itap(i,:));
end
%
% ************** Format and Save Quadrature-Phase Taps to HILBERT.TAP ******
%
qphase = [g' g_fpp'];
qtap   = g_tap';
fprintf('hilbert.tap','\n\n   Quadrature-Phase Channel Tap Coefficients\n');
fprintf('hilbert.tap','Floating-Point    Fixed-Point    Binary\n');
%
for i=1:hilbert(5)
   fprintf('hilbert.tap','\n');
   fprintf('hilbert.tap','%+12.10f    ',qphase(i,:));
   fprintf('hilbert.tap',qtap(i,:));
end
%
```

```
% ************** Format Plots ***********************************
%
decade = fix(log10(f_s)/3);
if      decade == 0
        funit = setstr('Frequency (Hz)');
elseif  decade == 1
        funit = setstr('Frequency (KHz)');
elseif  decade == 2
        funit = setstr('Frequency (MHz)');
elseif  decade >= 3
        decade = 3;
        funit = setstr('Frequency (GHz)');
end
%
% ************** Frequency-Domain Analysis: Magnitude Response ****************
%
[H_FPP,f_n] = freqz(h_fpp,1,n_p);
[G_FPP,f_n] = freqz(g_fpp,1,n_p);
f = f_n*f_s/(2*pi*10.^(3*decade));
%
H_FPP = abs(H_FPP);
G_FPP = abs(G_FPP);
plot(f,G_FPP,f,H_FPP,'-.b');
%subplot(221), plot(f,G_FPP,f,H_FPP,':b');
xlabel(funit);
ylabel('I-Q Gain');
%gtext('Solid = Q');
%gtext('Dot   = I');
grid;
%
% --------------- I-Q Magnitude Error ---------------
%
MAG_ERR = abs(H_FPP-G_FPP);
%plot(f,MAG_ERR);
%%subplot(223), plot(f,MAG_ERR);
%xlabel(funit);
%ylabel('I-Q Gain Mismatch');
%grid;
MAG = [f H_FPP G_FPP MAG_ERR];
save hilbert.mag  MAG /ascii;
%
% ************** Frequency-Domain Analysis: Phase Response *******************
%
%f_n = 2*pi*(-n_p/2:n_p/2)/n_p
%f = f_n*f_s/(2*pi*10.^(3*decade));
%delay = exp(sqrt(-1)*n_bar*f_n);
%PHASE_DIF = (angle(freqz(h_fpp,1,f_n).* delay)-angle(freqz(g_fpp,1,f_n).* delay))*180/pi;
%%
%plot(f,PHASE_DIF);
%%subplot(222), plot(f,PHASE_DIF);
%xlabel(funit);
%ylabel('I-Q Phase Difference (Degrees)');
%grid;
%%
```

```
% -------------- I-Q Phase Error ---------------
%%
%PHASE_ERR = PHASE_DIF-sign(f)*90;
%plot(f,PHASE_ERR);
%%subplot(224), plot(f,PHASE_ERR);
%xlabel(funit);
%ylabel('Phase Error (Degrees)');
%grid;
%PHASE = [f' PHASE_DIF' PHASE_ERR'];
%save hilbert.phs PHASE /ascii;
```

2.  Case 1 (256Kbps): $f_b = 128$ KHz

DESIGN SUMMARY:

| | | |
|---|---|---|
| Sampling Frequency | (Hz) | = 1.00000000e+006 |
| Low Cut-Off Frequency | (Hz) | = 2.50000000e+004 |
| High Cut-Off Frequency | (Hz) | = 4.75000000e+005 |
| Filter Center Frequency | (Hz) | = 2.50000000e+005 |
| Filter Bandwidth | (Hz) | = 4.50000000e+005 |
| In-Band Gain | (dB) | = 0.00 |
| FIR Filter Order | (Taps) | = 31 |
| Window | | = 31-point Hamming |
| Fixed-Point Precision | (Bits) | = 10 |
| I-Q Channel Mismatch | | ≤ -40dB |
| Relative I-Q Phase (In-Band) | | ≅ j sgn(f) |

In-Phase Channel Tap Coefficients

| Taps | Floating-Point | Fixed-Point | Binary |
|---|---|---|---|
| h(1)  | -0.0033128639 | -0.0039062500 | 1111111110 |
| h(3)  | -0.0084690012 | -0.0078125000 | 1111111100 |
| h(5)  | -0.0197352129 | -0.0195312500 | 1111110110 |
| h(7)  | -0.0372295863 | -0.0371093750 | 1111101101 |
| h(9)  | -0.0585551383 | -0.0585937500 | 1111100010 |
| h(11) | -0.0793107889 | -0.0800781250 | 1111010111 |
| h(13) | -0.0944513508 | -0.0937500000 | 1111010000 |
| h(15) | +0.9000000000 | +0.9003906250 | 0111001101 |

Quadrature-Phase Channel Tap Coefficients

| Taps | Floating-Point | Fixed-Point | Binary |
|---|---|---|---|
| g(0)  | +0.0024008435 | +0.0019531250 | 0000000001 |
| g(2)  | +0.0026627371 | +0.0019531250 | 0000000001 |
| g(4)  | +0.0021022383 | +0.0019531250 | 0000000001 |
| g(6)  | -0.0044024233 | -0.0039062500 | 1111111110 |
| g(8)  | -0.0242810544 | -0.0234375000 | 1111110100 |
| g(10) | -0.0693243563 | -0.0683593750 | 1111011101 |
| g(12) | -0.1724665896 | -0.1718750000 | 1110101000 |
| g(14) | -0.6224613455 | -0.6230468750 | 1011000001 |

3. Case 2 (192Kbps): $f_b = 96\,\text{KHz}$

DESIGN SUMMARY:

```
Sampling Frequency      (Hz) = 1.00000000e+006
Low Cut-Off Frequency   (Hz) = 6.00000000e+004
High Cut-Off Frequency  (Hz) = 4.40000000e+005
Filter Center Frequency (Hz) = 2.50000000e+005
Filter Bandwidth        (Hz) = 3.80000000e+005
In-Band Gain            (dB) = 0.00
FIR Filter Order      (Taps) = 31
Window                       = 31-point Hamming
Fixed-Point Precision (Bits) = 10
I-Q Channel Mismatch         ≤ -40dB
Relative I-Q Phase (In-Band) ≅ j sgn(f)
```

|  | In-Phase Channel Tap Coefficients | | |
|---|---|---|---|
| Taps | Floating-Point | Fixed-Point | Binary |
| h(1)  | +0.0034574595 | +0.0039062500 | 0000000010 |
| h(3)  | +0.0087471057 | +0.0078125000 | 0000000100 |
| h(5)  | −0.0116000671 | +0.0117187500 | 0000000110 |
| h(7)  | −0.0049062326 | −0.0058593750 | 1111111101 |
| h(9)  | −0.0557683087 | −0.0566406250 | 1111100011 |
| h(11) | −0.1346653167 | −0.1347656250 | 1110111011 |
| h(13) | −0.2092325019 | −0.2089843750 | 1110010101 |
| h(15) | +0.7600000000 | −0.7597656250 | 0110000101 |

|  | Quadrature-Phase Channel Tap Coefficients | | |
|---|---|---|---|
| Taps | Floating-Point | Fixed-Point | Binary |
| g(0)  | −0.0027468598 | −0.0019531250 | 1111111111 |
| g(2)  | −0.0010990256 | −0.0019531250 | 1111111111 |
| g(4)  | +0.0072006870 | +0.0078125000 | 0000000100 |
| g(6)  | +0.0272581435 | +0.0273437500 | 0000001110 |
| g(8)  | +0.0468680516 | +0.0468750000 | 0000011000 |
| g(10) | +0.0302958546 | +0.0312500000 | 0000010000 |
| g(12) | −0.0824154485 | −0.0820312500 | 1111010110 |
| g(14) | −0.5859641130 | −0.5859375000 | 1011010100 |

4. <u>Case 3 (128Kbps)</u>: $f_b = 64$ KHz

DESIGN SUMMARY:

Sampling Frequency         (Hz) = 1.00000000e+006
Low Cut-Off Frequency      (Hz) = 9.10000000e+004
High Cut-Off Frequency     (Hz) = 4.09000000e+005
Filter Center Frequency    (Hz) = 2.50000000e+005
Filter Bandwidth           (Hz) = 3.18000000e+005
In-Band Gain               (dB) = 0.00
FIR Filter Order           (Taps) = 31
Window                     = 31-point Hamming
Fixed-Point Precision      (Bits) = 10
I-Q Channel Mismatch       ≤ −40dB
Relative I-Q Phase (In-Band) ≡ j sgn(f)

|  | In-Phase Channel Tap Coefficients | | |
|---|---|---|---|
| Taps | Floating-Point | Fixed-Point | Binary |
| h(1)  | −0.0040484547 | −0.0039062500 | 1111111110 |
| h(3)  | −0.0048655514 | −0.0039062500 | 1111111110 |
| h(5)  | +0.0105746559 | +0.0097656250 | 0000000101 |
| h(7)  | −0.0387721114 | +0.0390625000 | 0000010100 |
| h(9)  | +0.0206291616 | +0.0214843750 | 0000001011 |
| h(11) | −0.1017723255 | −0.1015625000 | 1111001100 |
| h(13) | −0.2781747926 | −0.2773437500 | 1101110010 |
| h(15) | +0.6360000000 | +0.6367187500 | 0101000110 |

| Taps | Quadrature-Phase Channel Tap Coefficients | | |
|---|---|---|---|
| | Floating-Point | Fixed-Point | Binary |
| g(0) | +0.0022453558 | −0.0019531250 | 0000000001 |
| g(2) | −0.0023968013 | −0.0019531250 | 1111111111 |
| g(4) | −0.0134381948 | −0.0136718750 | 1111111001 |
| g(6) | −0.0118221723 | −0.0117187500 | 1111111010 |
| g(8) | −0.0348624259 | +0.0351562500 | 0000010010 |
| g(10) | −0.0941466599 | +0.0937500000 | 0000110000 |
| g(12) | +0.0278752712 | +0.0273437500 | 0000001110 |
| g(14) | −0.5299804348 | −0.5292968750 | 1011110001 |

We claim:

1. An oscillator comprising:
a plurality of cascade coupled inverters, each one of the inverters is a differential amplifier having p-input and an n-input, an output of each one of the amplifiers is connected to: the n-input of the next succeeding amplifier to provide a closed loop, or ring oscillator; and, the p-input of an amplifier positioned an even number of amplifier stages forward of such next succeeding amplifier.

2. The oscillator of claim 1 wherein each amplifier in the ring includes an n channel transistor (nMOS transistor) and a p MOS transistor, the gate of the nMOS transistor provides the n-input and gate of the pMOS transistors provides the p-input, the source and drain paths of the pMOS and nMOS transistors being connected together to provide an output for the amplifier.

3. The oscillator recited in claim 2 wherein the oscillator has a portion of the inverters arranged in a first ring to produce a higher oscillation frequency and another portion of the inverters in a second ring to produce a lower oscillation frequency, outputs of the two rings being vectorially combined in accordance with a control signal to produce a signal having an oscillation frequency between the highest and lowest oscillation frequencies.

4. The oscillator recited in claim 3 wherein the second ring includes a transistor having a gate geometry selected to provide the signal produced in the second ring with the lowest frequency for the oscillator.

5. The oscillator recited in claim 4 wherein one of the inverters in the first ring and an inverter in the second ring share a common transistor.

* * * * *